US008258501B2

(12) United States Patent
Werner et al.

(10) Patent No.: US 8,258,501 B2
(45) Date of Patent: Sep. 4, 2012

(54) USE OF A METAL COMPLEX AS AN N-DOPANT FOR AN ORGANIC SEMICONDUCTING MATRIX MATERIAL, ORGANIC OF SEMICONDUCTING MATERIAL AND ELECTRONIC COMPONENT, AND ALSO A DOPANT AND LIGAND AND PROCESS FOR PRODUCING SAME

(75) Inventors: Ansgar Werner, Dresden (DE); Olaf Kühl, Markkleeberg (DE); Simon Gessler, Heidelberg (DE); Horst Hartmann, Dresden (DE); Andre Grüssing, Dresden (DE); Michael Limmert, Dresden (DE); Andrea Lux, Dresden (DE); Kentaro Harada, Dresden (DE)

(73) Assignee: Novaled AG, Dresden (DE)

( * ) Notice: Subject to any disclaimer, the term of this patent is extended or adjusted under 35 U.S.C. 154(b) by 847 days.

(21) Appl. No.: 10/585,215

(22) PCT Filed: Mar. 3, 2005
(Under 37 CFR 1.47)

(86) PCT No.: PCT/DE2005/000372
§ 371 (c)(1),
(2), (4) Date: Feb. 24, 2009

(87) PCT Pub. No.: WO2005/086251
PCT Pub. Date: Sep. 15, 2005

(65) Prior Publication Data
US 2009/0212280 A1    Aug. 27, 2009

(30) Foreign Application Priority Data

Mar. 3, 2004  (DE) .......................... 10 2004 010 954

(51) Int. Cl.
*H01L 35/24*   (2006.01)
*H01L 51/00*   (2006.01)
(52) U.S. Cl. ....... 257/40; 257/E51.044; 585/5; 585/375; 548/103; 548/535; 548/564; 536/101; 536/121
(58) Field of Classification Search .............. 257/40, 257/E51.044; 585/5, 375; 548/103, 535, 548/564; 536/101, 121
See application file for complete search history.

(56) References Cited

U.S. PATENT DOCUMENTS

| | | | |
|---|---|---|---|
| 4,639,506 A * | 1/1987 | Sacconi et al. ................ | 528/212 |
| 6,569,544 B1 | 5/2003 | Alain et al. | |
| 2002/0142189 A1 | 10/2002 | Satoshi | |
| 2002/0179885 A1 | 12/2002 | Chi-Ming | |
| 2003/0072965 A1 | 4/2003 | Keizo | |
| 2003/0203168 A1 | 10/2003 | Kagan et al. | |

FOREIGN PATENT DOCUMENTS

| | | |
|---|---|---|
| EP | 0022271 | 1/1981 |
| EP | 1205527 | 5/2002 |
| EP | 1391944 | 2/2004 |
| WO | WO03022008 | 3/2003 |
| WO | WO03088271 | 10/2003 |
| WO | WO2004008554 | 1/2004 |
| WO | WO2004010136 | 1/2004 |
| WO | WO2004017043 | 2/2004 |
| WO | WO2005056717 | 6/2005 |

OTHER PUBLICATIONS

Dufour et al, "Complexation of 7-azaindole by the methylmercury(II) cation," Canadian Journal of Chemistry (1992), 70(12), pp. 2914-2921.*
Harada et al., "Realization of organic pn-homojunction using a novel n-type doping technique," Proceedings of the Spie, vol. 5464, Sep. 2004, pp. 1-9.
Pfeiffer et al., "Doped Organic Semiconductors: Physics and Application in Light Emitting Diodes," Organic Electronics, vo. 4, No. 2/3, pp. 89-103, Sep. 2003.
Bloom et al., "Low work function reduced metal complexes as cathodes in organic electroluminescent devices," Journal of Physical Chemistry, vo. 107, No. 13, pp. 2933-2938, Apr. 3, 2003.
Radius et al., "Dinuclear Molybdenum(III) and Tungsten(III) Calix'4!arene Complexes—Metal-Metal Triple Bonds Supported by Bridging Calix'4!arene Ligands," European Journal of Inorganic Chemistry, No. 3, pp. 299-303, Dec. 7, 1998.
Chisholm et al., "Preparation and characterization of the kinetic and thermodynamic isomers of dinuclear molybdenum and tungsten complexes with metal?metal triple bonds supported by p-tert-butylcalix'4!arene anions," Chemical Communications, No. 3, pp. 379-380, 1998.
English Translation of Japanese Office Action Mailed Dec. 14, 2010 in counterpart Japanese Application No. 2007-501110.
Chisholm et al., "M2(hpp)4Cl2 and M2(hpp)4, Where M = Mo and W: Preparations, Structure and Bonding, and Comparisons with C2, C2H2, and C2Cl2 and the Hypothetical Molecules M2(hpp)4(H)2", J. Am., Chem. Soc., 2003, 16040-16049, 125(51).
Cotton et al., "Synthesis and reactivity of a very strong reducing agent containing a quadruple bond: structures of W2(hpp)4 and W2(hpp)4Cl2-4CH2Cl2," Inorganic Chemistry Communications, 2003, 121-126, 6(2).
Cotton et al., "New multiply-bonded dimetal compounds containing bridging 1,3,4,6,7,8-hexahydro-2H-pyrimido[1,2-a]pyrimidinato groups—1. The V4+2, Cr4+2 and Mo4+2 compounds and some salts of the protonated ligand," Polyhedron, 1998, 179-184(6), 17(1).
Chinese Office Action mailed Jun. 4, 2012 for CN Application No. 200910118264.6.

* cited by examiner

*Primary Examiner* — Anthony Ho
(74) *Attorney, Agent, or Firm* — Sutherland Asbill & Brennan, LLP

(57) ABSTRACT

A method of using a metal complex as an n-dopant for doping an organic semiconducting matrix material in order to alter the latter's electrical characteristics is provided. In order to provide n-doped organic semiconductors with matrix materials having a low reduction potential, while achieving high conductivities, the n-dopant is a neutral electron-rich metal complex with a neutral or charged transition metal atom as a central atom and having at least 16 valence electrons. The complex can be polynuclear and can possess at least one metal-metal bond. At least one ligand can form a π complex with the central atom, which can be a bridge ligand, or it can contain at least one carbanion-carbon atom or a divalent atom. Methods for providing the novel n-dopants are provided.

51 Claims, No Drawings

USE OF A METAL COMPLEX AS AN N-DOPANT FOR AN ORGANIC SEMICONDUCTING MATRIX MATERIAL, ORGANIC OF SEMICONDUCTING MATERIAL AND ELECTRONIC COMPONENT, AND ALSO A DOPANT AND LIGAND AND PROCESS FOR PRODUCING SAME

CROSS REFERENCE TO RELATED APPLICATIONS

This application claims the benefit of International Patent Application No. PCT/DE2005/000372 filed Mar. 3, 2005, which claims priority to German Patent Application No. 102004010954.0-33 filed Mar. 3, 2004, both of which applications are hereby incorporated by reference in their entireties herein.

FIELD OF THE INVENTION

The invention relates to the use of a metal complex as a dopant for doping an organic semiconducting matrix material in order to alter the electrical characteristics of the matrix material. The invention further relates to an organic semiconducting material containing an organic matrix material and a metal complex as an n-dopant and having an electronic component. The invention further relates to n-dopants and ligands, as well as to novel processes for their production.

BACKGROUND OF THE INVENTION

The invention relates to the use of a metal complex as a dopant for doping an organic semiconducting matrix material in order to alter the latter's electrical characteristics, the compound constituting an n-dopant with regard to the matrix material; it also relates to an organic semiconducting material containing an organic matrix material and a metal complex as an n-dopant, and also to an electronic device with an organic semiconducting material which is doped with a metal complex as an n-dopant. The invention further relates to n-dopants and ligands and processes for producing them.

It is known to modify organic semiconductors with regard to their electrical characteristics, especially their electrical conductivity, by doping them, which is also the case with inorganic semiconductors such as silicon semiconductors. In the process, charge carriers are generated in the matrix material in order to increase its conductivity, which is initially quite low, and, depending on the nature of the dopant used, to produce a change in the Fermi level of the semiconductor. In this context, doping leads to an increase in the conductivity of charge transport layers, thus reducing ohmic losses, and to an improved passage of the charge carriers between the contacts and the organic layer. In organic matrix materials, inorganic dopants are generally disadvantageous because of their high diffusion coefficients, since they impair the functioning and stability of the electronic devices. In addition, it is known to release dopants by means of chemical reactions in the semiconducting matrix material, in order to provide dopants. However, the oxidation potential of the dopants released in this way is often not sufficient for various applications, such as for organic light-emitting diodes (OLED) in particular. Furthermore, when the dopants are released, other compounds and/or atoms are produced, such as atomic hydrogen for example, as a result of which the characteristics of the doping layer or the corresponding electronic device are impaired.

What is more, organic compounds used as dopants often do not have a sufficiently low oxidation potential for the application in question.

DESCRIPTION OF THE INVENTION

The present invention is therefore aimed at solving the problem of providing metal complexes as n-dopants for doping an organic semi-conducting matrix material, especially for manufacturing electronic devices, which in particular also have sufficiently low oxidation potentials to produce electron transport materials for organic light-emitting diodes (OLED), without having any disturbing influences on the matrix material, and which cause an effective increase in the number of charge carriers in the matrix material and are preferably comparatively easy to handle. In addition, it is an object of the invention to provide suitable ligands and processes for producing the dopants.

These objects are achieved by the features of the independent claims, in particular by the use of neutral electron-rich metal complexes. In addition, the problem is solved by the provision of an organic semiconducting material with a compound of a neutral electron-rich metal complex of this kind as an n-dopant. Preferred embodiments can be learned from the dependent claims.

As a consequence of the fact that an electron-rich metal complex is used in a neutral form as an n-dopant vis-à-vis the organic semiconducting matrix material, there is a considerably stronger donor available than in organic donor compounds known hitherto. Furthermore, compared to other n-dopants in the form of organic compounds, the provision of a neutral electron-rich metal complex makes it possible to vary the donor characteristics of the compound by selecting a suitable central atom, and thus to vary its oxidation potential. The n-dopants of the invention thus preferably have a very low oxidation potential. The complex preferably has at least one organic ligand, without being restricted to that. In particular, the use of the n-dopants of the invention can substantially increase the conductivity of charge transport layers, and/or the passage of the charge carriers between the contacts and the organic layer can be improved considerably in applications as electronic devices.

The metal complexes used in accordance with the invention are preferably isolated molecules, which are thus preferably present in the semiconducting layer concerned as isolated molecules that are not immobilized by chemical bonds among each other and/or by being bound to a matrix and/or to another component. The valence electrons of the metal central atoms, with the exception of the valence electrons of the complex which are associated directly with the metal atom, are thus preferably provided substantially or completely by the ligands of the complex and the metal atoms of the complex, these being arranged within the coordination sphere formed by the ligands, which is preferably at least substantially closed. Preferably, all the metal atoms of the complex or all the metal atoms of an outer sphere of the metal complex are coordinated to non-metallic ligands, preferably organic ligands. It goes without saying that individual metal complexes may in each case be bound to one another or to other components, such as the matrix material, in order optionally to immobilize the metal complexes. For this purpose, the ligands may, for example, possess suitable functional groups that can be linked together, such as unsaturated groups, which may react with one another in a linear or branched manner to form an oligomer or polymer.

The complexed central atom may have a formal number of valence electrons VE of 16 or more, such as 18 or 19 or 20 or 21 or more valence electrons. The central atom may in this case in particular be a metal atom from the first transition metal period, a metal atom from the second transition metal period or a metal atom from the third transition metal period. Independently thereof or in combination with it, the complexes of the invention may be at least binuclear complexes with at least one metal-metal bond between the central atoms, as a result of which particularly electron-rich metal complexes with a high electron density at the central atom of the metal complex can be provided in each case.

It is particularly preferred to have a neutral or charged transition metal atom as the central atom of the electron-rich metal complex. The central atom may, for example, be a metal atom from the group of the first transition metal period (scandium to zinc), or a metal from the second transition metal period (yttrium to cadmium), e.g. rhodium, palladium, silver and cadmium, or a metal from the third transition metal period, including lanthanides and actinides. The central atom may in particular be a metal from the 7th to 10th groups. The transition metal of the at least one central atom may also be one of the following elements in each case: V, Cr, Mn, Fe, Co, Ni, Cu, Zn, Nd, Ta, Mo, W, Rh, Ir, Pd, Pt. The transition metal atom is particularly preferably selected from the group Mn, Fe, Co, Ni, Cu, Zn, e.g. selected from the group Fe, Co, Ni. In addition, the transition metal atom may be selected from the group Cr, Mo, W. The transition metal atom may also be selected from the group V, Nb, Ta or the group Ir, Pt, Au, Hg. For various intended uses, however, metal complexes with a smaller formal number of valence electrons at the metal central atom of the complex, or with a lower electron density at the metal central atom may also be used.

In the neutral metal complex used in accordance with the invention, the transition metal atom may be present as a neutral atom or as a charged transition metal atom, preferably with a formal charge of 0 to 3, e.g. a formal charge of 0, 1 or 2, it being in particular possible for the central atom to be an atom from the first transition metal period. The charge of the central atom, which may be an atom from the first, second or third transition metal periods, may also be different from 0.

At least one, two or more, or all of the ligand atoms (donor atom) binding to the central atom may be different from an aromatic nitrogen atom which is part of an aromatic 6-membered ring, in which the nitrogen atom has a double bond with a neighboring atom, especially a carbon atom. In complex chemistry, pyridine, pyrimidine, pyridazine or pyrazine are often used as such ligands. At least one, two or more, or all of the ligand atoms binding to the central atom may optionally also be different from an aromatic nitrogen atom of a 5-membered ring, such as a pyrrole or imidazole ring, for example. In these cases, however, the aromatic ring of the substituent may not have a coordinating nitrogen atom or a substituent with an N atom. In particular, at least one ligand atom binding to at least one central atom may be present which is different from the nitrogen atom of a pyridine, 2,2'; 6',2''-terpyridine or 2,2'-bipyridine, in particular different from 4,4',5,5'-tetramethyl 2,2'-bipyridine. What has been said above may in each case apply to substituted or unsubstituted ligands. In particular, what has been said above may apply to Cr or Ru complexes. It goes without saying, however, that ligands of this kind are not generally excluded from the invention; optionally, one, two or more, or all of the donor atoms may have the above-mentioned characteristic.

In particular, at least one ligand may also be at least bi-dentate or tridentate, and at least one, two or more of the donor atoms of the ligands binding to a central atom can be different from nitrogen.

At least one, two or more donor atoms of the at least one ligand, or 1, 2, 3 or 4 or more, or all of the donor atoms of the complex may, for example, be an $sp^3$-configured nitrogen atom, such as the nitrogen atom of a substituted or unsubstituted alkylamine moiety which is not also encompassed by what has been said above. One, two or more, such as 3, 4 or all, of the ligand atoms binding to at least one central atom of the neutral metal complex may optionally be different from an aromatic nitrogen atom or different from nitrogen in general. Independently of this or at the same time, one, two, three, four or more, or all of the donor atoms of at least one or all of the central atoms of the complex may be different from oxygen, without this being compulsory.

Preferably, at least one ligand atom binding to the central atom is selected from the group consisting of B, Al, Ga, In, C, Si, Ge, Sn, Pb, P, As, Sb, Bi, S, Se, Te and optionally also O, where 2, 3, 4 or more, or all of the ligand atoms binding to the central atom may be selected from that group. Preferably, at least 1, 2, 3 or 4 or more, or all of the donor atoms are selected from the group consisting of B, C, Si, Ge, Sn, S, P, Se, As, Sb, Te (optionally including N), in particular selected from the group B, C, S, P, Se (optionally including N). It goes without saying that, in addition, at least one of the ligand atoms may in each case also be selected from the group Si, Ge, Sn, As, Sb, Te.

At least 1, 2, 3 or 4 or more, in particular also all of the ligand atoms binding to the central atom may also have a lower electronegativity than nitrogen (electronegativity according to Allred-Rochow for N: 3.07).

It goes without saying that the above statements regarding the ligand atoms binding to the central atom (donor atoms) apply to mononuclear metal complexes, but also to polynuclear metal complexes in which the ligand atom binding to the central atom may bind to only one central atom, but also to two or three central atoms, for example, in the case of a polynuclear complex. In this case, the ligand concerned may be a monodentate or also a bidentate, tridentate or polydentate ligand, where different ligand atoms may bind to different metal atoms of the metal complex of the invention and may, in the process, form bridging ligands, for example. It also goes without saying that, in the case of polynuclear metal complexes with preferably two, but also with three or more central atoms, which in each case are preferably transition metal atoms, which may be neutral or charged, metal-metal bonds can exist between two or more central atoms. As far as the valence electrons are concerned, these metal-metal bonds may formally correspond to a single bond but also optionally to a metal-metal multiple bond, though a metal-metal bond may also be present whenever the electron density between the metal atoms is lower than that for a metal-metal single bond. It goes without saying that the other metal atoms of a polynuclear metal complex are not to be understood as ligand atoms for the purposes of the invention.

At least 1, but optionally also 2, 3 or 4 or more, or all of the donor atoms of the metal complex may be components of a heterocyclic unsaturated ring, where the heteroatom is preferably the atom binding to the central atom of the metal complex. The heteroatom can in particular be an N, S, P or Se atom, but optionally also an O atom, though without being restricted to that. The heterocyclic unsaturated ring may optionally contain further heteroatoms, which may also be different from the first heteroatom. The metal complex can have 1, 2, 3, 4 or more, or all of the ligand atoms as components of such a heterocyclic unsaturated ring. The heterocyclic unsaturated ring may have 5, 6 or 7 ring atoms, though without being restricted to that.

Preferably, 1, 2, 3, 4 or more, or all of the donor atoms of the complex are components of an aromatic ring or a conjugated—e.g. mesomeric—system of the ligand, wherein the donor atom can bind, for example, to one or two multiply bonded atoms.

In the following, some advantageous classes of compounds will be described in more detail:

π Complexes

According to one advantageous embodiment, at least one ligand of the neutral metal complex forms a π complex with the central atom. The ligand of the π complex can coordinate with a multiple bond, i.e. a double bond or triple bond, to the central atom, where the multiple bond may, for example, be a C—C, C—O, C—N, S—O, N—O, though without being restricted to that. The ligand forming the π complex may have a mesomeric or aromatic system which forms the π complex with the central metal atom. The π complex may, for example, contain a 2-electron donor such as a double or triple bond, a 3-electron donor such as an allyl group or an $\eta^3$-1-3-cyclohexenyl group, a 4-electron donor such as a butadiene or cyclobutadiene group, a 5-electron donor such as an $\eta^5$-1-5-cyclohexadienyl group or in particular a 6-electron donor group such as a benzene nucleus, a cyclopentadienyl anion, a cycloheptatrienyl cation, cycloheptatrienyl tri-anion, cyclooctadienyl di-anion or the like. It goes without saying that the complex may also have two or more ligands that form a π complex with the central atom. In particular, the complex may comprise two ligands forming a π complex with the central atom, which can coordinate the central atom, in particular in a linear manner. It goes without saying that the π complex may also comprise further ligands, which do not coordinate with the central atom via a π electron system. Ligands of this kind may, for example, be carbonyl, phosphines or the like, without being restricted to these. It further goes without saying that the π complex may also have two or optionally more ligands coordinating with the central atom via a π bond system, these ligands being different from one another, in particular with regard to the number of electrons in the π electron system and/or with regard to the number of coordinating atoms, in particular the number of ring atoms in the case of aromatic π complexes. The central atom may, for example, be coordinated by a π benzene ligand and/or a π cyclopentadienyl ligand or by two π cyclopentadienyl ligands or two π benzene ligands, such as dibenzene iron, which are differently substituted, or by a cyclopentadienyl or benzo ligand on the one hand, and a ligand complexing via a double or triple bond on the other, where the double or triple bond may optionally also have a heteroatom. As π complexes, the biscyclopentadienyl complexes may be $\eta^5$ complexes, though without being restricted to that.

In general, one, more than one, or all of the ligands of the complex may be selected from the group comprising compounds I-10 (with compound 5 in particular as a singly or doubly charged anion or cation). In the parent compounds I-10, one or more than one or possibly even all of the C, CR, $CR_2$, $C^-$, $CR^-$, $CR^{2-}$ groups may be isoelectronically or non-isoelectronically substituted by appropriately identical or different heteroatoms. In particular, one or more than one of the groups CR or $C^-$ may be replaced by P. At the same time or alternatively, one or more than one of the groups $CR_2$ or $CR^-$ may be replaced by S. The following elements may be used as heteroatoms: B, Al, Ga, In, N, P, As, Sb, Bi, Si, Ge, Sn, Pb, O, S, Se, Te, optionally also without O. In particular, the heteroatoms may be selected from the group B, Al, Ga. Furthermore, the heteroatoms may be selected in particular from the group N, P, As, Bi, preferably selected from the group N, P, As. In addition, the heteroatoms may be selected from the group Si, Ge, Sn, Pb, in particular from the group Si, Ge. Also, the heteroatoms may be selected from the group O, S, Se, Te, in particular from the group O, S, Se. In particular, the heteroatoms from the groups mentioned may also in each case be atoms of the third main group period (atomic numbers in particular between 13 and 16) or the fourth main group period (atomic numbers in particular between 31 and 34).

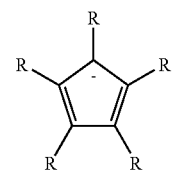

1

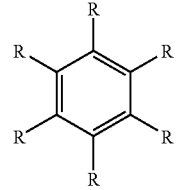

2

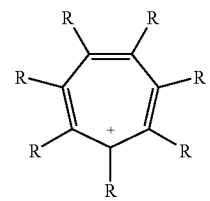

3

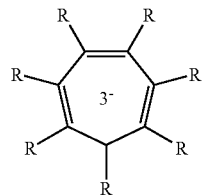

3a

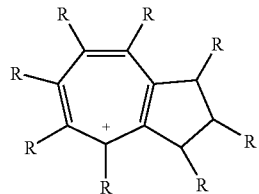

4

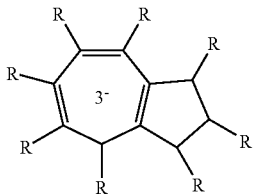

4a

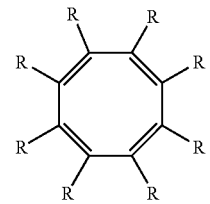

5

-continued

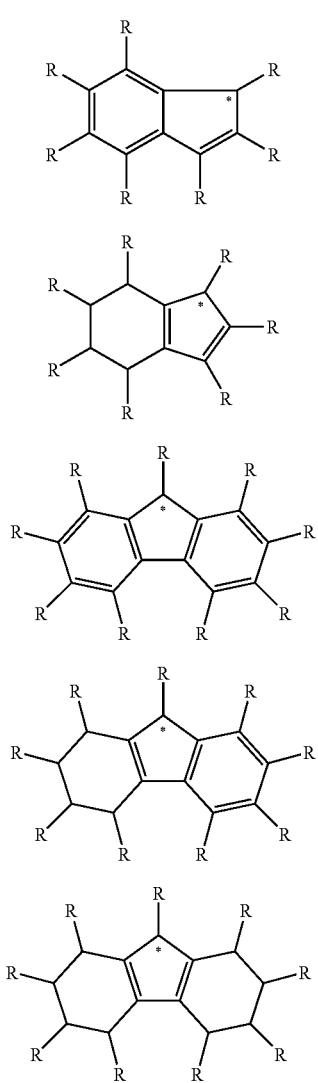

6

7

8

9

10

The groups R in the parent compounds I-10 may be the same or different, open-chain or components of a ring or ring system, and are preferably selected from: alkyl, including cycloalkyl, aryl, or the above heteroatoms. The alkyl or aryl groups may be completely or partially substituted with one or more heteroatoms from the above list, which may be the same or different. It goes without saying that the above groups R, but also quite generally groups in accordance with the invention, may be ones with a +I effect and/or +M effect on an unsaturated or aromatic ring (or P instead of N). Generally speaking, the R groups in compounds according to the invention may also have unsaturated groups, e.g. with C=C, C=N bonds or the like.

The central atom of the complexes may in each case be selected from the group Mn, Fe, Co, Ni, Cu, Zn or the group Cr, Mo, W, particularly preferably those selected from the group Fe, Co, Ni, such as complexes with Fe or Co. The central atom may also be a different metal atom from groups 6 or 7 to 10.

In particular, 1, 2 or all of the ligands may in each case be cyclopentadienyl or benzene or may be selected from the group of compounds 3, 4 and 5 or from the group of compounds 6, 8 and 9, in particular also compound 8, or selected from the group of compounds 7, 10, where the ligands may in each case be substituted or unsubstituted.

Paddlewheel Complexes and Polynuclear Complexes in General

According to one advantageous embodiment, the metal complex of the invention is a polynuclear metal complex. In particular, the metal complex may be a polynuclear metal complex with at least one, two, three or four or optionally even more ligands which bind to at least two metal central atoms. The metal complex may in this case also have one, two or more metal-metal bonds, which may in each case be metal-metal single bonds or metal-metal multiple bonds. The polynuclear complex may have two, three or even four or more metal central atoms. The complex preferably does not contain more than 20 or not more than 10 metal atoms or not more than 6 or 4, in particular not more than 3 metal atoms. The metal complexes are in each case preferably isolated molecules. Polynuclear complexes may in particular be carbonyl or cyclopentadienyl complexes.

The metal atoms of polynuclear metal complexes are preferably mainly or entirely transition metal atoms, in particular from the 6th or 7th to 10th groups, selected, for example, from the group Cr, Mn, Fe, Co, Ni, Cu, Zn, Mo, W.

A metal complex of this kind may, for example, be a so-called paddlewheel complex 65, wherein two metal central atoms, in particular transition metal central atoms are bridged by 1, 2, 3, 4 or more bidentate ligands which in each case bind one ligand atom to both metal central atoms. The metal atoms in this case are usually coordinated 4-fold or optionally even 5-fold or higher.

65

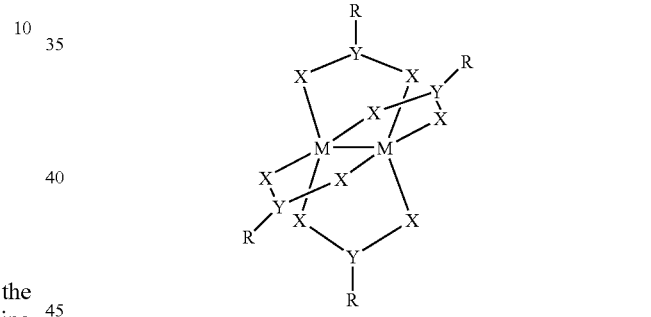

One or both metal central atoms M may optionally also be complexed, in each case independently of one another, with at least one further ligand, such as carbonyl, phosphine or others, which may in particular be disposed axially (terminally) to the M-M bond.

In particular, the polynuclear metal complexes may have at least one atom from the group Mn, Fe, Co, Ni, Cu, Zn, in particular an atom from the group Fe, Co, Ni or at least one atom selected from the group Cr, Mo, W, in particular also Mo, W, where preferably all the central atoms of the neutral metal complex are identical. In general, M can be any metal atom at all, in particular a transition metal atom, such as a transition metal atom from the first, second or third transition metal periods or an atom from the 6th or 7th to 10th transition metal groups. In this context, both metal atoms M can in each case be the same or different from one another.

Instead of the bidentate ligands $RYX_2$ bridging the two metal central atoms together, it is also possible for one or more of the bridge ligands to be replaced by monodentate ligands, such as by carbonyl, RCN, substituted or unsubstituted phosphines or others, where the substituent R can be any organic residue including hydrogen, in particular also a hydrocarbon residue or a substituted or unsubstituted alkyl residue, in particular a C1 to C10 alkyl residue, in particular C1 to C4 or to C6.

At least one, more or all of the ligand atom(s) X binding to the metal atom may be selected from the group F, Cl, Br, I, O, S, Se, N, P, such as halogen, preferably selected from the group O, S, Se, N, P, particularly preferably selected from the group S, Se, N, P, where at least one, two, three or four or all of the ligand atoms can be different from N. X may, however, also be a different suitable atom. The various atoms X binding to the metal atom can be the same or different within a ligand or within the complex. This means that different ligands L, L' may also be used as bidentate ligands bridging the two metal atoms. The atom Y is preferably an element from the main group, in particular a bi-, tri- or tetracovalent element from the main group. The atom Y is preferably selected from the group B, C, N, O Si, P, S, As, Se, Sb, Te, especially preferably selected from the group O, S, Se, N, P, C, in particular selected from the group S, Se, N, P (optionally also O), without being restricted to these.

In a preferred embodiment of the present invention, one or more of the ligands are selected from the group of halides, carboxylates, formamidinates, pyrimido-pyrimidines including their anions, in particular substituted or unsubstituted pyrimido[1,2-a]pyrimidine or their anions, in particular hpp (hpp: anion of 1,3,4,6,7,8-hexahydro-2H-pyrimido[1,2-a]pyrimidine), and guanidinates, optionally also diketonates. In this context, the ligands can in each case be the same or different from one another. In particular, at least one ligand is a carboxylate, a formamidinate, a pyrimido-pyrimidine, in particular hpp, or a guanidine. In particular, all the ligands of the complex are in each case a carboxylate, a formamidinate, a pyrimido-pyrimidine, in particular hpp, or a guanidine, all the ligands of the complex preferably being the same. The ligands are particularly preferably selected from the group of carboxylates, formamidinates, pyrimido-pyrimidines and guanidinates. The Y and also X groups, especially carboxylates, formamidinates, pyrimido-pyrimidines and guanidinates, optionally also diketonates, can each be substituted or unsubstituted; they may, for example, have substituted or unsubstituted alkyl residues or hydrocarbon residues, for example in each case with C1 to C10 or higher, in particular C1 to C6 or C2 to C4, or other substituents.

At this point, however, and also generally in the context of this invention, the term "alkyl residue" also comprises cycloalkyl residues, in particular cycloheptyl, cyclohexyl or cyclopentyl residues.

Of the list given above, the structural types 65a, 65b, 65c and 65d are preferred, and these will be described in more detail in the following:

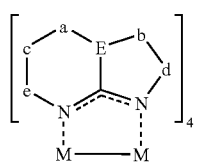

Type 65a the structural elements a-e may mean: a=—CR$_1$R$_2$—, b=—CR$_3$R$_4$—, c=—CR$_5$R$_6$—, d=—CR$_7$R$_8$— and e=—CR$_9$R$_{10}$—, where R$_1$, R$_2$, R$_3$, R$_4$, R$_5$, R$_6$, R$_7$, R$_8$, R$_9$ and R$_{10}$ are, at the same time or independently of one another, H, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or —OR;

preferably, R$_1$, R$_3$, R$_5$, R$_7$, R$_9$=H and R$_2$, R$_4$, R$_6$, R$_8$, R$_{10}$=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or —OR, or optionally, a or b or e or d may be NR with R=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, or optionally, a and d or b and e may be NR with R=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, or at c, C is replaced by Si, wherein the bonds b-d and c-e or b-d and a-c can, at the same time or independently of one another, be unsaturated, wherein the bonds b-d, a-c and c-e can, at the same time or independently of one another, be part of a saturated or unsaturated ring system which may also contain the heteroelements O, S, Se, N, P, Si, Ge, Sn, or wherein the bonds b-d, a-c and c-e can, at the same time or independently of one another be part of an aromatic or condensed aromatic ring system which may also contain the heteroelements O, S, Se, N, wherein the atom E is an element from the main group, preferably selected from the group N, P, As, Sb, though without being limited to these, wherein the structural element a-E-b may optionally be a component of a saturated or unsaturated ring system which may also contain the heteroelements O, S, Se, N, P, Si, Ge, Sn, or the structural element a-E-b may optionally be a component of an aromatic ring system which may also contain the heteroelements O, S, Se, N, wherein the metal M is a transition metal, preferably W or Mo;

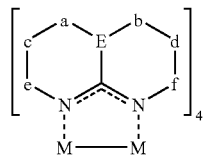

Type 65b where the structural elements a-f may mean: a=—CR$_1$R$_2$—, b=—CR$_3$R$_4$—, c=—CR$_5$R$_6$—, d=—CR$_7$R$_8$—, e=—CR$_9$R$_{10}$— and f=CR$_{11}$R$_{12}$, where R$_1$, R$_2$, R$_3$, R$_4$, R$_5$, R$_6$, R$_7$, R$_8$, R$_9$, R$_{10}$, R$_{11}$ and R$_{12}$ are hydrogen, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or —OR; preferably R$_1$, R$_3$, R$_5$, R$_7$, R$_9$, R$_{11}$=H and R$_2$, R$_4$, R$_6$, R$_8$, R$_{10}$, R$_{12}$=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or —OR, the structure 65b with R$_1$, R$_2$, R$_3$, R$_4$, R$_5$, R$_6$, R$_7$, R$_8$, R$_9$, R$_{10}$, R$_{11}$ and R$_{12}$=H being excluded from this, or in the structural elements c and/or d, C may be replaced by Si, or optionally, a or b or e or f may be NR with R=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, or optionally, a and f or b and e may be NR with R=C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, wherein the bonds a-c, b-d, c-e and d-f, but not simultaneously a-c and c-e and not simultaneously b-d and d-f may be unsaturated, wherein the bonds a-c, b-d, c-e and d-f can be part of a saturated or unsaturated ring system which may also contain the heteroelements O, S, Se, N, P, Si, Ge, Sn, or the bonds a-c, b-d, c-e and d-f may be part of an aromatic or condensed aromatic ring system which may also contain the heteroelements O, S, Se, N, wherein the atom E is an element from the main group, preferably selected from the group N, P, As, Sb, though without being limited to these, wherein the structural element a-E-b may optionally be a component of a saturated or unsaturated ring system which may also contain the heteroelements O, S, Se, N, P, Si, Ge, Sn, or the structural element a-E-b may optionally be a component of an aromatic ring system which may also contain the heteroelements O, S, Se, N, wherein the metal M is a transition metal, preferably W or Mo;

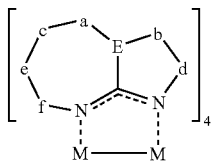

Type 65c where the structural elements a-f may mean: a=—$CR_1R_2$—, b=—$CR_3R_4$—, c=—$CR_5R_6$—, d=—$CR_7R_8$—, e=—$CR_9R_{10}$— and f=$CR_{11}R_{12}$, where $R_1$, $R_2$, $R_3$, $R_4$, $R_5$, $R_6$, $R_7$, $R_8$, $R_9$, $R_{10}$, $R_{11}$ and $R_{12}$ can, at the same time or independently from one another, be H, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$ or —OR; preferably $R_1$, $R_3$, $R_5$, $R_7$, $R_9$, $R_{11}$=H and $R_2$, $R_4$, $R_6$, $R_8$, $R_{10}$, $R_{12}$=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$ or —OR, or at c or e, C may be replaced by Si, or optionally, a or b or d or f may be NR with R=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, or optionally, a and d or b and f may be NR with R=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, wherein the bonds a-c, c-e, e-f and b-d, but not simultaneously a-c, c-e and e-f and not simultaneously a-c and c-e and not simultaneously c-e and e-f may be unsaturated, wherein the bonds a-c, c-e, e-f and b-d can be part of a saturated or unsaturated ring system which may also contain the heteroelements O, S, Se, N, P, Si, Ge, Sn, or the bonds a-c, c-e, e-f and b-d may be part of an aromatic or condensed aromatic ring system which may also contain the heteroelements O, S, Se, N, wherein the atom E is an element from the main group, preferably selected from the group N, P, As, Sb, though without being limited to these, wherein the structural element a-E-b may optionally be a component of a saturated or unsaturated ring system which may also contain the heteroelements O, S, Se, N, P, Si, Ge, Sn, or the structural element a-E-b may optionally be a component of an aromatic ring system which may also contain the heteroelements O, S, Se, N, wherein the metal M is a transition metal, preferably W or Mo;

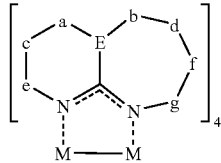

Type 65d wherein the structural elements a-g may mean: a=—$CR_1R_2$—, b=—$CR_3R_4$—, c=—$CR_5R_6$—, d=—$CR_7R_8$—, e=—$CR_9R_{10}$—, f=$CR_{11}R_{12}$ and g=$CR_{13}R_{14}$, where $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ can, at the same time or independently from one another, be H, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$ or —OR; preferably, $R_1$, $R_3$, $R_5$, $R_7$, $R_9$, $R_{11}$, $R_{13}$=H and $R_2$, $R_4$, $R_6$, $R_8$, $R_{10}$, $R_{12}$, $R_{14}$=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$ or —OR, or at c, d and f, though not d and f simultaneously, C may be replaced by Si, or optionally, a or b or e or g may be NR with R=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, or optionally, a and g or b and e may be NR with R=$C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, wherein the bonds a-c, c-e, b-d, d-f and f-g, but not simultaneously a-c and c-e, and not simultaneously b-d, d-f and f-g, and not simultaneously b-d and d-f, and not simultaneously d-f and f-g, may be unsaturated, wherein the bonds a-c, c-e, b-d, d-f and f-g can be part of a saturated or unsaturated ring system which may also contain the heteroelements O, S, Se, N, P, Si, Ge, Sn, or the bonds a-c, c-e, b-d, d-f and f-g may be part of an aromatic or condensed aromatic ring system which may also contain the heteroelements O, S, Se, N, wherein the atom E is an element from the main group, preferably selected from the group N, P, As, Sb, though without being limited to these, wherein the structural element a-E-b may optionally be a component of a saturated or unsaturated ring system which may also contain the heteroelements O, S, Se, N, P, Si, Ge, Sn, or the structural element a-E-b may optionally be a component of an aromatic ring system which may also contain the heteroelements O, S, Se, N wherein the metal M is a transition metal, preferably W or Mo.

For the residues R in the structures 65a-65d, the definitions for the structure 65, as described above, can be used.

The ligands which are used to produce structures 65a-65d are also in accordance with the invention.

Further Complex Ligands

Preferably, at least one, two or more, or all of the ligands are selected from the group of borates, carboranes, triazacycloalkanes, triazacycloalkenes, pyrroles, thiophenes, pyrazoles, imidazoles, thiazoles, oxazoles, pyridines, pyridazines, pyrimidines, pyrazines. In particular, at least one, two or more, or all of the ligands are selected from the group of borates, carboranes. At least one, more or all of the ligands may be selected from the group of triazacycloalkanes, triazacycloalkenes, optionally also other amines. At least one, two or more or all of the ligands may be selected from the group of pyrroles, thiophenes, pyrazoles, imidazoles, thiazoles and optionally oxazoles. At least one, two or more or all of the ligands may be selected from the group of pyrines, pyridazines, pyrimidines, pyradzines. The ligands may in each case be the same or different and may in each case be selected from one of the groups mentioned or from more than one of the groups mentioned. In particular, whenever a ligand is selected from the group of borates and carboranes, another ligand may be an arene or arenyl π-ligand, such as a substituted or unsubstituted cyclopentadienyl, benzene or cycloheptatrienyl ion, for example.

The central atom of the respective complex may in each case be selected from the group Mn, Fe, Co, Ni, Cu, Zn or selected from the group Cr, Mo, W, particularly preferably selected from the group Fe, Co, Ni, such as complexes with Fe or Co. The central atom may also be a metal atom from groups 6 or 7 to 10.

Carboranes

Preferred carboranes are those of the type $[R_2C_2B_4]^-$, $[R_2C_2B_9H_9]^{2-}$, $[R_2C_2B_{10}H_{10}]^{2-}$, where R may be any substituents, in particular alkyl substituents, in particular lower alkyl substituents with $C_{1-6}$. The substituents R may in each case be the same or different.

Borates

If the ligand is a borate anion, the borate preferably possesses the general structure 15 (Table 2), where R is any substituent, preferably H, alkyl, in particular lower alkyl with $C_1$-$C_6$ or aryl, in particular benzyl, or a hydrocarbon residue in general. It goes without saying that the substituent R may also possess heteroatoms, in particular N, O or halogen. R' is any substituent, preferably alkyl, in particular lower alkyl with $C_1$ to $C_6$ or aryl, where R' may possess heteroatoms such as, in particular, N, O, halogen. R' may also be a pure hydrocarbon. For R", the statements regarding R apply. The various substituents R, R' or R" may in each case be the same or different. Two substituents R" may be part of a ring system, in particular part of an identical ring system, preferably part of a ring system fused to the skeleton, or parent structure. The ring system may be saturated, unsaturated, in particular aromatic. E is an at least divalent atom and may be selected from the group O, S, Se, Te, optionally selected from the group O, S, Se or selected from the group S, Se and Te. The group E of the various ring systems may in each case be the same or different. X is a "spacer", where optionally 1, 2 or 3 of the X groups may be missing in the compound 15. X may be a branched or unbranched alkyl chain with or without heteroatom substituents, in particular an alkyl chain with 1 to 6, especially $C_1$ to $C_4$ or $C_1$ to $C_2$, an aryl substituent, including a heterosubstituted aryl substituent, a fused aryl substituent with or without heteroatoms, an alkyl aryl substituent with or without a heteroatom or a heteroatom. The heteroatom is in each case preferably selected from the group N, P, S, Se, Ge, Sn, without being restricted thereto. The various groups X in the compound 15 may in each case be the same or different. X is preferably an alkyl chain, particularly preferably a lower alkyl chain with C1 to C6. Y is a heteroatom or carbon atom capable of acting as a donor, preferably selected from the group N, P, S, Se, Ge, Sn, optionally selected from the group N, P, S, Se or selected from the group P, S, Se, Ge, Sn. In compound 15, the various donor atoms Y may in each case be the same or different. Y may be part of a ring or a ring system, in particular an unsaturated ring or ring system, including an aromatic or heteroaromatic ring system. The ring possessing the hetero or carbon atom Y capable of acting as a donor preferably comprises 5 to 7 ring atoms, such as 5 or 6. The ring containing the donor atom Y may in each case have more heteroatoms, which can be the same or different, such as two or three. The heteroatoms may in each case be N atoms, for example, or possess at least one N atom.

In particular, the borate may possess fewer than three, two or one, or no oxygen-donor atom.

In particular, the borate may be one of the compounds 11, 12, 13, 14 or 16, wherein the metal complex may also possess different borate ligands, in particular different borate ligands from said group of compounds 11, 12, 13, 14 or 16.

In this context, the Y atom, like borates in general, especially borates according to compound 20, may in each case also be a component of a pyrrole, indole, carbazole, furan, benzofuran, thiophene, benzothiophene, pyradzole, imidazole, thiazole, or oxazole ring. One or more of the Y atoms can also be components of a pyridine, quinoline, isoquinoline, acridine, pyridazine, pyrimidine, pyrazine, quinoxaline, pteridine, or purine ring, wherein the donor atom Y binding to the central atom may be a component of a 5 or 6-membered ring. In general, Y may be a component of a (hetero)aromatic ring. Said rings may in each case also be partially or fully saturated. In general, Y may be a component of a 3 to 8-membered, especially 3, a 3 to 6-membered, in particular 5 or 6-membered ring. Y may, in particular as a ring, possess the heteroatoms O, N, P, S, Se, Ge, Sn, especially the heteroatoms O, N, P, S. C may form a carbanion in this context; C, Ge and Si may form carbenes (C(II)), germylenes (Ge(II)) and silylenes (Si (II)). The ring preferably has one or two multiple bonds which are in conjugation with the donor atom Y.

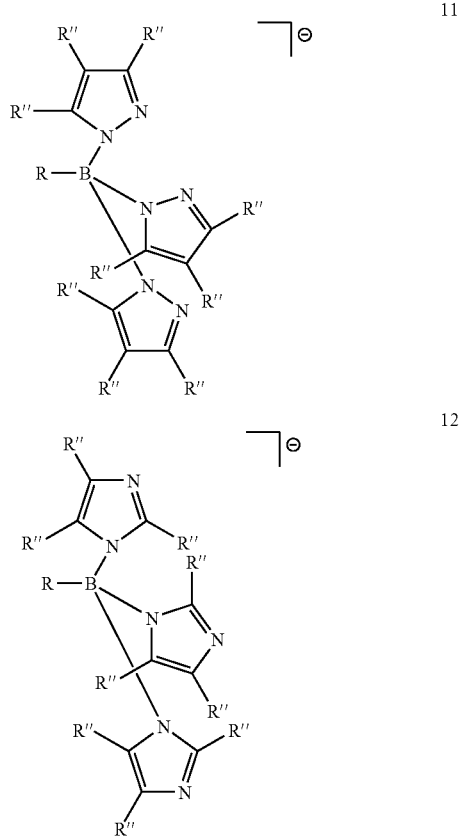

-continued

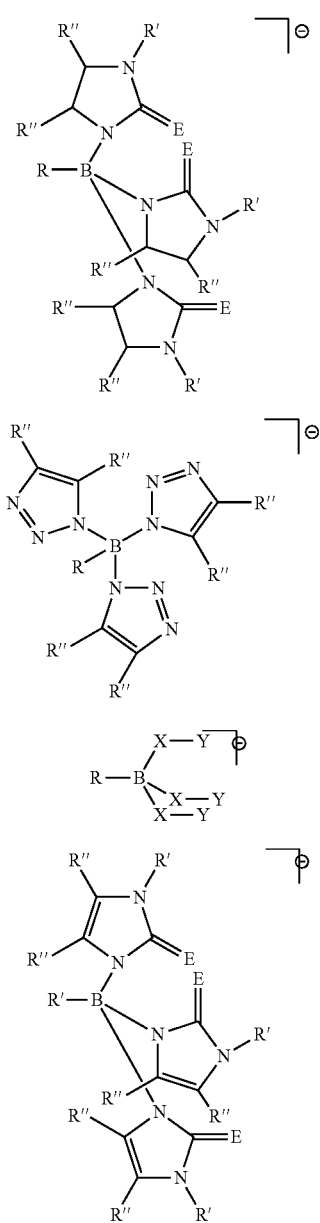

It goes without saying that the residues Y in compound 15 may be the same or different.

Proceeding from compound 16 or from one of the compounds 11, 12, 13, 14 or 16, the borate may optionally also be only a bidentate or even only a monodentate ligand, in which one or two of the X-Y groups are replaced in each case by one substituent R, independently of one another, including H, where two substituents R may also form a saturated or unsaturated ring. In the process, the tridentate borate ligands may coordinate, especially facially, to the central atom.

In the compound 15, the B atom may optionally also be replaced by an Al or Ga atom.

The central atom of the carborane or borate-metal complexes, in particular the compounds 11, 12, 13, 14 or 16, can preferably be selected from the group Cr, Mn, Fe, Co, Ni, Cu, Zn, especially from the group Fe, Co, Ni; the metal atom can also be selected from the group Cr, Mo, W; it may be Cr, Mo or W, for example, or a metal from the transition metal groups 7 to 10.

Tripod Ligands

According to a further advantageous embodiment, at least one, two or all of the ligands of the neutral metal complex may be a tripod ligand 18, which thus possess three ligand atoms,

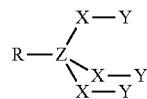

18 which bind to at least one central metal atom of the complex concerned and bind to a central atom via further atoms or groups, which have the function of spacers. Compounds according to formula 15 are tripod ligands of this kind. It goes without saying, however, that the central B atom of compound 15, for example, can be replaced by a C, Si, P or As atom, though without being restricted to that. In general, the tripod ligand according to formula 18 may possess a suitable central atom Z, which may be an element from the main group, but also a transition metal atom. Independently thereof, Z can be a metal atom, in particular also a metal atom from the main group. Z is an at least trivalent atom. Z is preferably carbon, but it may in particular also be B or P. As to the rest, what has been stated above with regard to the borates applies to the groups R, X and Y. In particular, the groups -X-Y may also be formed in accordance with the compounds 11, 12, 13, 14 and/or 16.

In particular, in the tripod ligand, Y is generally also an atom capable of acting as a donor, which may be a heteroatom or a carbon atom. At least one, more or all of the heteroatoms of the tripod ligand are preferably selected from the group N, P, S, Se, Ge, Sn, optionally also Si, though without being restricted to that. The donor atom may in each case carry a charge, especially a negative charge; it may, for example, be a carbanionic carbon. The donor atom may also occur in a lower valency than its maximum valency; it may, for example, be a carbene-carbon atom, a germylene-germanium atom, a silylene-silicon atom, a Sn(II) or even a Pb(II) atom. Preferably, at least one donor atom of the ligand is a carbanion-carbon atom or an atom with lower than its maximum valency, especially C, Ge, Si; this applies particularly preferably to all the donor atoms of the ligand. Y may optionally also be a component of a ring or ring system. The donor atoms of the tripod ligand are preferably the same as one another, but they may also be different from one another.

The ligand preferably has at least one or two donor atoms as the carbanion-carbon atom binding to at least one metal central atom or, with regard to the ligand, a formally divalent atom selected from the group C (carbene), Si (silylene), Ge (germylene), optionally also Sn or Pb, which are in each case components of an aromatic or non-aromatic, preferably unsaturated ring, where the multiple bond may be in conjugation with the free electrons of the donor atom. The ring possessing the donor atom preferably has at least one or two further heteroatoms, preferably selected from the group N, P, As, S, Se or Te, especially N, S, Se, which may be the same or different in each case.

Triazacycloalkanes

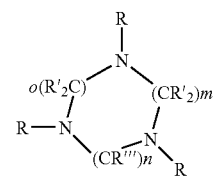

17

One, two, more or all of the ligands of the metal complex of the invention may be triazacycloalkanes, especially those of the general formula 17, where m, n, O are integers, preferably integers from 0 to 6 independently of one another in each case, preferably from 0 to 4, particularly preferably 1 or 2 independently of one another in each case. m, n and o may be the same or different from one another in each case. Substituents R can be any residues, preferably alkyl residues, especially lower alkyl residues with C1 to C6, or aryl residues, including hydrogen. The alkyl or aryl residues may be substituted or unsubstituted. The residues may be the same or different in each case. All or several of the substituents R may be free electron pairs, as a result of which the ligand formally receives one or more negative charges. The residues R' may be any substituents, preferably hydrogen, alkyl or aryl; as for the details in this context, the statements concerning the residue R apply mutatis mutandis. The various residues R' may be the same or different. It goes without saying that one or more of the N atoms of the triazacycloalkanes may also be replaced by an atom selected from the group P, As, Sb. Triphosphacycloalkanes are preferred here.

It also goes without saying that, in the event that m, n and/or o are integers of 2 or greater, the above-mentioned groups between the heteroatoms of the cyclic ligands may also be unsaturated, for example forming triaza(hetero)cycloalkenes, dialkenes, trialkenes or the like. The alkyl or aryl residues of the substituents R and/or R' may in each case also possess heteroatoms.

Fullerenes

In addition, complexes are preferred in which at least one, two or all of the ligands are Buckminster fullerenes, which bind to the central atom of the complex. The Buckminster fullerenes may in particular be C60 and/or C70 fullerenes. Derivatives of these fullerenes, especially substituted fullerenes, are thus also encompassed hereby. In this context, the fullerenes ultimately constitute substituted cyclopentadienyl ligands, since the latter complex the central metal atom via the cyclopentadienyl ring.

Pincer Ligands

In addition, so-called pincer ligands, which act as tridentate ligands vis-à-vis the central metal atom of the complex, are particularly preferred. In particular, such pincer ligands may be bound meridionally to the central atom. The pincer ligands may in particular be 6-electron donors. The (formally uncomplexed) pincer ligands may be neutral or charged, preferably negatively charged.

Preferably, one, two or all of the pincer ligands of the complex possess the general structures 27, 27a, 28 or 28a in accordance with the formulae below; one, two or all of the pincer ligands of the complex, for example, possess one of the structures 27 or 28, or 27a or 28a. In particular, all the ligands of the complex may possess the structures 27 or 27a or 28 or 28a. It goes without saying that the pincer ligands of a complex may be the same or different. The pincer ligands thus have a central ring with a heteroatom Z or C=atom (carbanion), which binds to the central metal atom, and two further ligand atoms Y, which are linked via bridge atoms or bridging atom groups X to the ring possessing the heteroatom Z. Optionally, one or more of the groups X in the ligands according to the compounds 27, 27a, 28 or 28a may also be missing. The groups X and/or Y within the ligands 27, 27a, 28 or 28a may be the same or different in each case. In particular, the ring carrying the middle ligand atom of the pincer ligands may be a 5-membered or 6-membered ring, which may optionally possess one or more heteroatoms, one of which may be a donor atom. One or both of the X-Y groups in this case may likewise be rings or components of ring systems, especially components of 5 or 6-membered rings, which may in each case possess further heteroatoms in addition to the Y atom. The Y atom may in each case also be a carbon atom. At least one, two or three donor atoms Y, Y' and Z of the pincer ligands or one, two or three or more of the donor atoms of the complex possessing at least two pincer ligands may be different from nitrogen. The pincer ligand may possess at least one or two or more rings containing one ligand atom in each case with a number of ring atoms different from 6, especially a 5-membered ring. That ring may be the ring containing the middle ligand atom Z, or it may form one of the X-Y groups. All the donor atoms may be components of a 5-membered ring, which can in each case be unsaturated or aromatic.

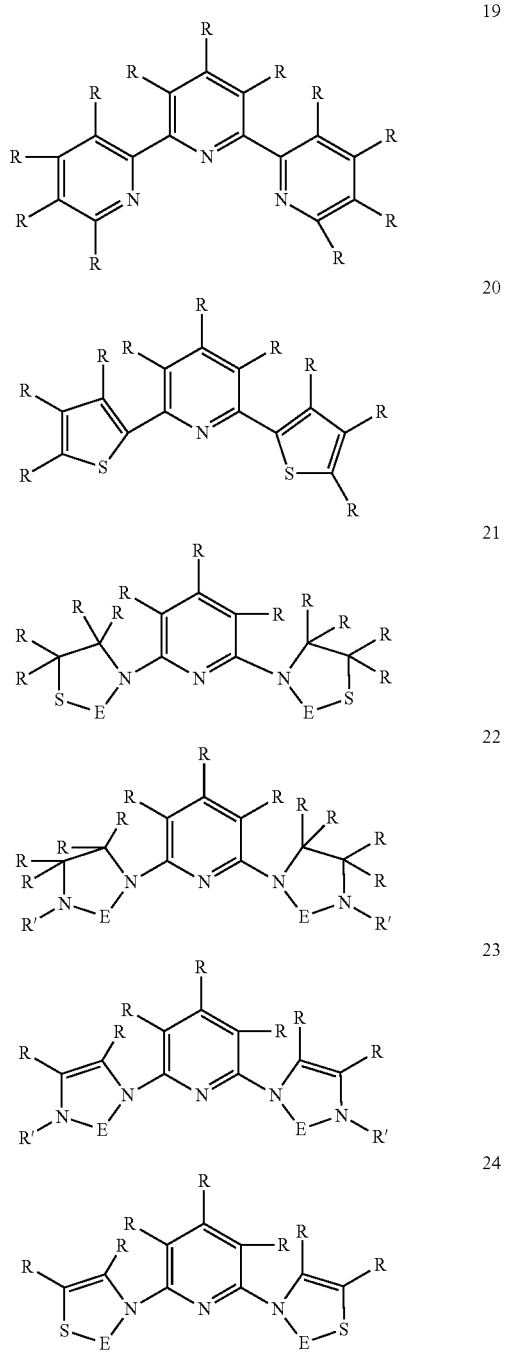

-continued
| | |
|---|---|
| 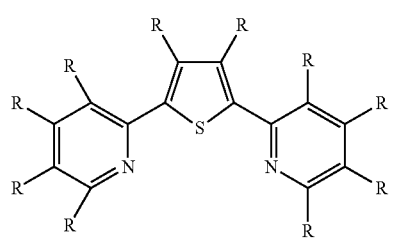 25 | 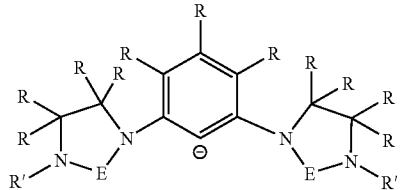 32 |
| 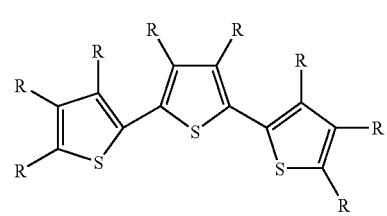 26 | 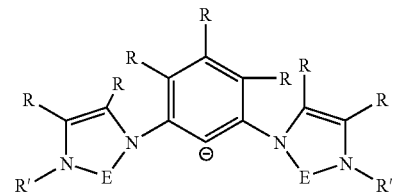 33 |
| 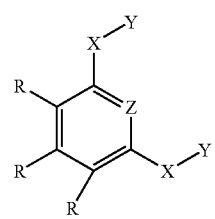 27 | 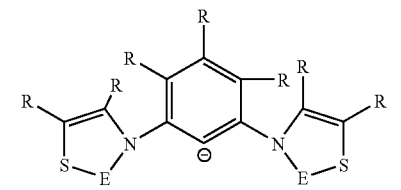 34 |
| 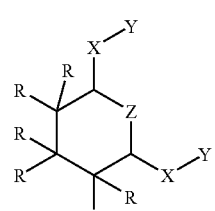 28 | 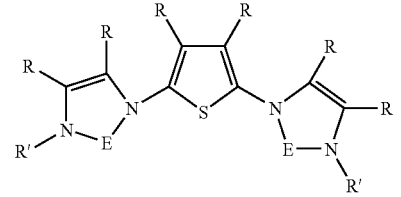 35 |
| 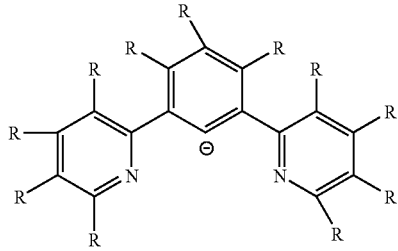 29 | 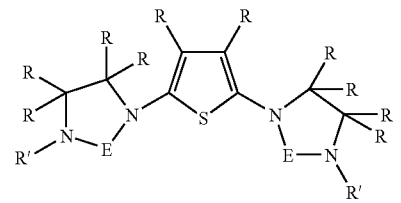 36 |
| 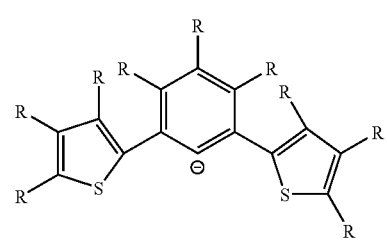 30 | 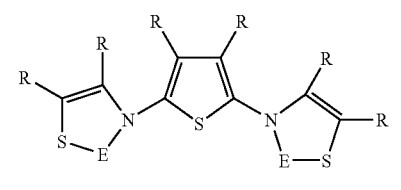 37 |
| 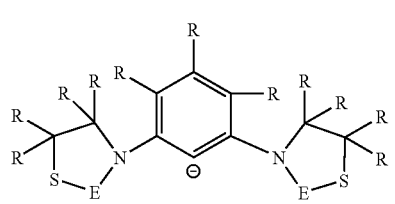 31 | 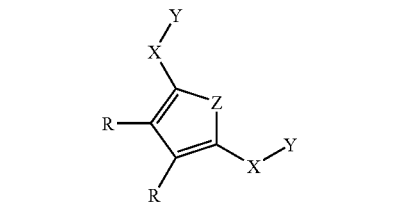 27a |
| | 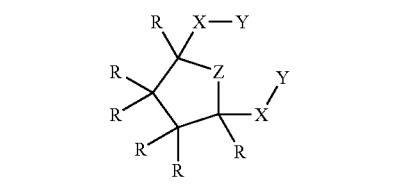 28a |
One, two or more donor atoms of the ligands or all the donor atoms of the complex may in each case be components of an aromatic ring or a conjugated, unsaturated system. This applies in particular to donor atoms S, C(II) (carbene), C(carbanion), Si(II) and/or Ge(II). In the case of lower-valent donor atoms, e.g. divalent donor atoms such as carbene, germylene, silylene, the donor atom may in particular also be adjacent to one or two heteroatoms with a free electron pair, such as N, P, As, Ab, S, Se, Te, which is preferably in conjugation with orbitals of the donor atom that are vacant or not maximally occupied. This may apply both to the pincer ligands and also to the monodentate or bidentate ligands mentioned below.

In the compounds 27, 27a, 28, 28a, Y is a heteroatom or carbon atom capable of acting as a donor, preferably selected from the group N, P, O, S, Se, Te, C, Si, Ge, Sn, Pb, e.g. selected from the group C, N, P, O, S, Se, though without being restricted to that. The Y atom may be different from N. The two Y atoms may be the same or different. Y may be part of a ring or ring system. In particular, Y may be a carbon atom, e.g. a carbanion or carbene carbon atom, or a Ge atom, in particular a germylene (Ge(II)), or Si atom, especially a silylene (Si(II)), or a sulphur atom.

Z is a heteroatom or carbon atom capable of acting as a donor, preferably selected from the group C, N, P, O, S. If at least one of the Y atoms is an N atom, Z may be different from N. In particular, Z may be a carbon atom, e.g. a carbanion or carbene carbon atom, or Ge atom, in particular a germylene (Ge(II)), or a Si atom, especially a silylene (Si(II)), or a sulphur atom.

X is a "spacer" and may be any at least divalent atom or a group of atoms. In particular, X can be a branched or unbranched alkyl chain, in particular a lower alkyl chain with C1 to C6, preferably C1 to C4 or one or two atoms, where X may possess no heteroatoms or one or more heteroatoms. The heteroatoms can be components of the bridge. X can be an aryl substituent, including a condensed aryl substituent with or without heteroatoms, including an alkyl-aryl substituent with or without a heteroatom. X may also be a single heteroatom, such as O, S, N, P or the like. R can be any substituent, preferably H, alkyl, in particular a lower alkyl with C1 to C6, or aryl. The alkyl or aryl residue can be substituted or unsubstituted and may optionally have one or more heteroatoms. The individual substituents R may be the same or different. Two substituents R may be part of a ring, which can be saturated, unsaturated, including aromatic, and may preferably be part of a ring system fused to the skeleton. The statements with regard to R apply to R', R' being in particular an atom other than hydrogen or a group of atoms. The substituents R' may in each case be the same or different from one another.

E may in each case be an atom selected from the group C, Si, Ge, Sn, Pb, preferably selected from the group C, Si, Ge, in particular C or Ge, for example in oxidation state (II) in each case. The donor atom E may form a carbene, germylene or silylene ligand; preferably, two donor atoms E in each case form a bis-carbene, bis-germylene or bis-silylene ligand or mixed ligands with these donor atoms. The ring of the pincer ligand possessing an E atom preferably has, optionally apart from E, at least one or two further heteroatoms, which are preferably in each case components of a ring, preferably a unsaturated or aromatic ring. The further heteroatom(s) preferably bind(s) to the E atom, optionally via an unsaturated system such as a double bond. Heteroatoms may in particular be N or S. The ring possessing the donor atom E (in particular as carbene C(II), Ge(II), Si(II)) may have two additional N atoms, two S atoms or one N and one S atom.

The complex possessing at least one, more than one or exclusively pincer ligands preferably has at least one central atom selected from the group Cr, Mn, Fe, Co, Ni, Cu, Zn, preferably selected from the group Mn, Fe, Co, Ni, particularly preferably selected from the group Fe, Co, Ni, optionally including Mn. The at least one central atom can be selected from the group Cr, Mo, W, and may, for example, be Mo or W, optionally also Cr. The central atom may also generally be an atom from the 7th to 10th transition metal groups; in this context, it may be different from Cr or Ru, though this is not compulsory.

In particular, compounds 20 to 26 and 29 to 37 may possess the central atoms mentioned above, which may optionally be different from Cr or Ru. The compounds 20 to 26 and 29 to 37 may, however, also possess a different central atom selected from the group of the first, the second or the third transition metal periods.

The ligand may be selected from the group of compounds 20 to 24, where one or more of the atoms S or N of the terminal five-membered rings may also be replaced in each case by Se, Te or optionally O, or P, As or Sb. One or more of the double bonds of the five-membered rings of the compounds 20 to 24 may optionally also be saturated. E can in each case be in particular carbene carbon C(II), Ge(II) (germylene) or Si(II) (silylene), optionally also O.

The pincer ligand may further be selected from the group of compounds 25 or 26, where the S atom of the middle 5-membered ring or one or both of the S atoms of the terminal 5-membered rings of the compound 26 may be a Se or Te atom, optionally also O. One or more of the double bonds of the system may also be saturated. It may in each case in particular be carbene carbon C(II), Ge(II) or Si(II).

For example, the ligand may be selected from the group of compounds 29, 30, 31, where one or more of the S atoms may be replaced by Se or Te, optionally also O, and one or more of the N atoms may be replaced by P, As or Sb. E can in particular be carbene carbon C(II), Ge(II) or Si(II) in each case.

The pincer ligand can be selected from the group of compounds 32 to 34, where E may in particular be a divalent C (carbene), Si (silylene) or Ge (germylene) atom. One or more of the N atoms may be replaced by P, As or Sb. One or more of the S atoms may be replaced by Se or Te, or optionally O.

The pincer ligand may further be selected from the group of compounds 35, 36 or 37, where E is preferably a divalent carbon atom (carbene), Si(II) or Ge(II). At least one of the N atoms may be replaced by P, As or Sb. At least one of the S atoms may be replaced by Se or Te, or optionally O.

If the ligand from the group of compounds 19 to 26 and 29 to 37, in particular the compounds 20 to 26 and 29 to 37, possesses a divalent ligand atom E selected from the group C, Si, Ge, Sn, Pb, in particular selected from the group C, Si, Ge, the central atom of the complex is preferably cobalt, in particular Co (II) or Ru, in particular Ru(0).

In addition, the ligand may be a bidentate ligand of the general structure 45, 45a, 46, 46a. The X-Y group may in particular form a heterocyclic ring with Y as the hetero donor atom, the ring preferably being a 5 or 6-membered ring. As far as the atoms or groups of atoms Z, X and Y and the substituents R and R' are concerned, reference may be made to the above comments regarding the pincer ligands.

In particular, one, two or all of the ligands of the complex may be selected from the group of compounds 45, 45a, 46, 46a, such as a compound 45 or 45a or 46 or 46a, with the above statements regarding the pincer ligands applying to the groups Z, X, Y.

In particular, one, two or all of the ligands of the complex may be selected from the group of compounds 38 to 44 and 47 to 56, in particular from the group of compounds 39 to 44 and 47 to 56, with the above statements regarding the pincer ligands applying mutatis mutandis to the groups R and E. In particular, here too, the ligand may possess a ring with a divalent donor atom S, C, Si, Ge, Sn, Pb, in particular a donor atom C, Si, Ge, so that corresponding carbanions, carbenes, silylenes or germylenes are present.
38
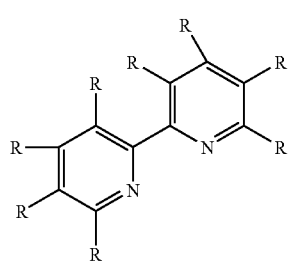
39
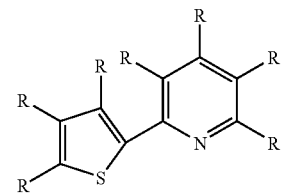
40
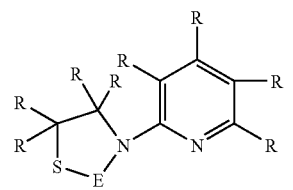
41
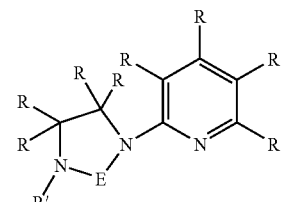
42
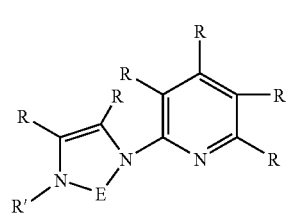
43
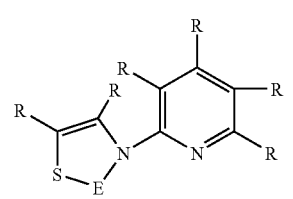
44
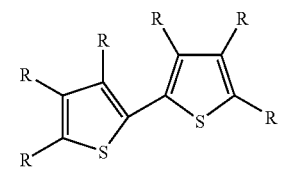
-continued
45
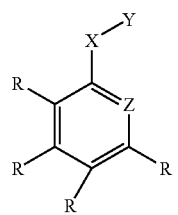
46
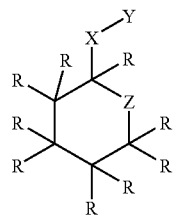
47
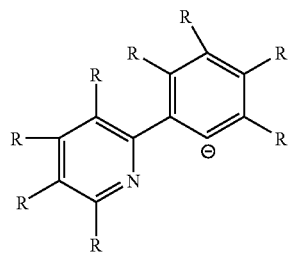
48
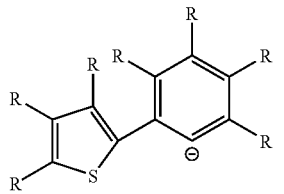
49
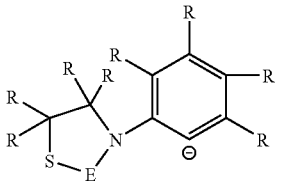
50
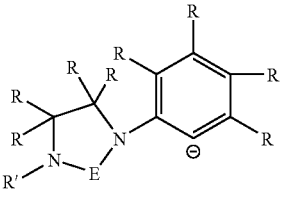
51
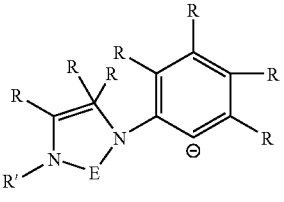

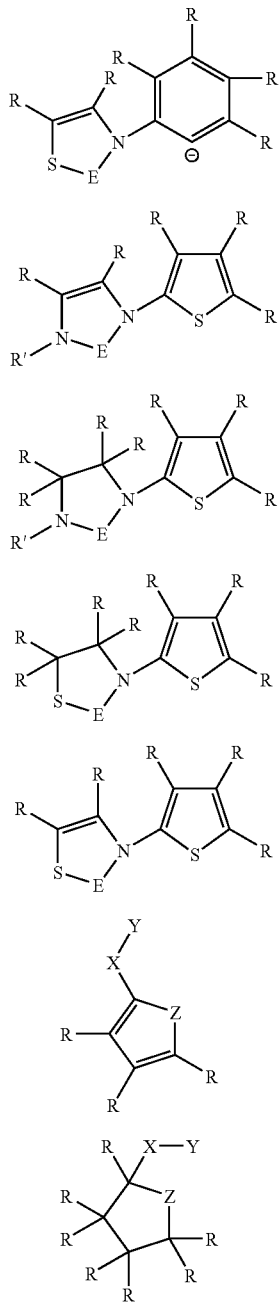

In particular, a ligand with one of the general structures 27, 27a, 28, 28a, 45, 45a, 46, 46a may possess a Z atom with C⁻ (carbanion) or C(II) (carbene). In particular, one or both of the ligand atoms Y may then be an E atom selected from the group C, Si, Ge, Sn, Pb, in particular selected from the group C, Si, Ge, E being divalent (within the ligand).

In particular, the donor atom Y of one of the compounds 27, 27a, 28, 28a, 45, 45a, 46, 46a may be the sulphur atom of a thiophene ring which may optionally also be replaced by Se or Te, optionally also by O.

In addition, the ligand may be selected from the group of compounds 40, 41, 42, 43, where in each case N may also be replaced by P, As or Sb, and S may in each case be replaced by Se, Te, optionally also O.

In addition, the ligand may be selected from the group of compounds 47, 48, 49, 50, 51, 52, in particular also from the group of compounds 49, 50, 51, 52, where in each case S may be replaced by Se or Te or optionally also O, and N may be replaced by P, As, Sb.

The ligand may also be selected from the group of compounds 53, 54, 55 and 56, where S may be replaced by Se, Te or optionally O, and N may be replaced by P, As or Sb, E preferably being C(II) (carbene), Si(II) (silylene) or Ge(II) (germylene).

In addition, at least one, more or all of the ligands may be selected from the group of compounds 57 to 64, in particular selected from the group of compounds 59 to 64, the statements regarding the pincer ligands applying mutatis mutandis to E and R, R'. The statements concerning Y or Z with regard to the pincer ligands apply to X as a carbon or hetero donor atom. In particular, the compound 58 may be an, optionally substituted, cyclopentadienyl anion, thiophene, pyrrole, selenophene, phosphene or furan. E is preferably a divalent atom from the group C (carbene), Si (silylene), Ge (germylene), Sn, Pb, preferably selected from the group C, Si, Ge. E can in particular also be C⁻ (carbanion). Optionally, one or more double bonds of the compounds 57 to 64 may also be saturated.

In compounds of the type 27, 27a and 28, 28a and specifically in the compounds 19 to 26 and 29 to 37, in particular 20 to 26 and 29 to 37, and in the compounds 45, 45a, 46, 46a, specifically in the compounds 38 to 44 and 47 to 56, 39 to 44 and 47 to 56, and in the compounds 57 to 64, in particular in the compounds 59 to 64, preferably at least one, more or all of the rings possessing a donor atom in each case has a hydrocarbon group with 1, 2 or 3 or more, preferably 4 or more carbon atoms, preferably a non-substituted alkyl group or also a substituted alkyl group. The number of C atoms in the group is preferably from 4 to 20 or 4 to 10, inclusive in each case, such as 4 to 6. Preferably, at least one, two or all of the rings are substituted with at least one substituent which exhibits a more powerful +I effect and/or a +M effect vis-à-vis hydrogen or a methyl group. Preferably, at least one, two or all of the donor atoms has/have a +M substituent assigned to it/them which is in conjugation with it/them. Preferably, one, two or more or all of the rings are substituted with at least one alkyl group or a group with the same or a more powerful +I effect. It goes without saying that at least one, more or all of the rings may also possess +M substituents, such as N-alkyl or N-dialkyl substituents (or P instead of N), what has been said above applying to alkyl.

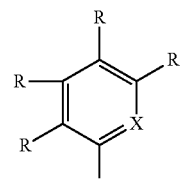

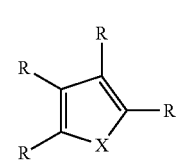

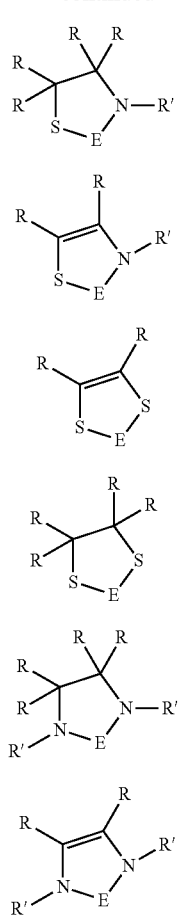

It goes without saying that, in the event that at least one or all of the central atoms possess more than one substituent, two or all of the substituents belong to the same substituent type in each case or may be the same.

Ionization Potential/Oxidation Potential

The metal complex of the invention preferably has an ionization potential in the gas phase of ≦6.4 eV, preferably ≦6 eV, especially ≦5.5 eV. In particular, the ionization potential of the complex in the gas phase may be ≦5.0 eV or ≦4.5 eV.

The gas phase ionization potential Ipg of the compounds that can be used in accordance with the invention can be determined with reference to tetrathiafulvalene (TTF), for example, which is: Ipg=6.4 eV (see R. Gleiter, E. Schmidt, D. O. Cowan, J P. Ferraris, J. Electr. Spec. Rel. Phenom. 2, 207 (1973)).

The oxidation potential of TTF is E½(ox)=−0.09 V against Fe/Fe+ (ferrocene/ferrocenium) (M. Iyoda, T. Takano, N. Otani, K. Ugawa, M. Yoshida, H. Matsuyama, Y. Kuwatani, Chem. Lett., 1310 (2001)). Proceeding from that point of reference, the redox potential of the n-dopants of the invention against ferrocene/ferrocenium can be ≦−0.09 V, preferably ≦−0.6 V, particularly preferably ≦−1.1 V, such as ≦−1.6 V or ≦−2.1 V, though without being restricted to that.

The oxidation potential against ferrocene/ferrocenium can, for example, be determined cyclovoltammetrically. The potential in this case is largely independent of the electrolyte system used and can be determined in accordance with the IUPAC Recommendation (Gritzner, G.; Kuta, J. Pure Appl. Chem. 1984, 56, 461-466). The electrolyte system must have a sufficiently large electrochemical window and the donor compound must be sufficiently soluble. An example of a suitable electrolyte system is acetronitrile/1M LiClO$_4$/Pt electrodes, though other suitable electrolyte systems can also be used.

Vapor Pressure

The vapor pressure of the complex used in accordance with the invention may in particular be <10$^{-3}$ Pa at 30° C., such as ≦5×10$^{-4}$ Pa or ≦1×10$^{-4}$ Pa.

The n-dopants of the invention used in each case and/or the complexes used in each case may be stable in air; optionally, the n-dopants and/or complexes of the invention used in each case may also be instable in air.

Synthesizing the n-dopant Complexes of the Invention and their Ligands

General

The n-dopant metal complexes of the invention may be synthesized, for example, by synthesizing the compounds directly or by reducing salts, the resulting neutral metal complex then being present in the salt as a cation. The anion may be any suitable anion, such as a halogen, perchlorate, sulphate or the like. The reduction may be effected electrochemically or chemically for example, though without being restricted to that. The reduction may be effected, for example, by electrocrystallization, and the product obtained in this way, which can be harvested at the working electrode, can subsequently be purified. The complexes of the invention may in particular also be produced without using such an electrocrystallization step, however.

Synthesis Process

The complexes of the invention can be synthesized using known processes; in some cases, they are also commercially available. The synthesis of the ligands of the complexes of the invention and of the complexes themselves is described in the following passages in the literature for example, each of which is hereby incorporated in the application in full by reference. It goes without saying that the cited passages from the literature are only mentioned by way of example, and that the ligands and complexes can in most cases also be synthesized by other suitable processes.

Paddlewheel Complexes

The paddlewheel complexes can be isolated either by ligand substitution from other paddlewheel complexes (F. A. Cotton, J. G. Norman Jr., J. Coord. Chem. 1 (1970) 161-72; F. A. Cotton, D. J. Timmons, Polyhedron 17 (1998) 179-84), by salt metathesis from the metal halide and an anionic ligand (F. A. Cotton, D. J. Timmons, Polyhedron 17 (1998) 179-84), by reducing a cationic paddlewheel complex (F. A. Cotton, P. Huang, C. A. Murillo, X. Wang, Inorg. Chem. Commun. 6 (2003) 121-6), or in a redox reaction from a metal compound and the ligand (T. A. Stephenson, E. Bannister, G. Wilkinson, J. Chem. Soc. (1964) 2538-41).

In addition, a new process has been developed, according to which the paddlewheel complexes of type 65a-d can be isolated efficiently in a single-stage synthesis process. For this purpose, a corresponding inorganic metal salt with free bases of the ligands shown in 65 a-d and a suitable strong reducing agent are heated to reflux in a suitable organic solvent, until the reaction has taken place completely. Suitable solvents to be used are preferably those in which the complexes formed exhibit sufficient stability, though preferably dialkyl ether, cyclic ether, cyclic and open-chain polyether such as 1,4-dioxan, dimethoxyethane, etc., aromatic compounds and mixtures thereof.

Suitable reducing agents are, for example, base metals, preferably alkali metals such as sodium, potassium and caesium. After separation of the inorganic by-products, the complexes are isolated by crystallization, precipitation or sublimation.

The novel single-stage synthesis method opens up a time and resource-saving access to complexes of the type $W_2L_4$.

Some practical embodiments are provided in the following:

Synthesizing the Ligands and their Precursors

EXAMPLE 1

1. Imidazo[1,2-a]pyrimidine hydroperchlorate

The production process followed a method described in the literature (M. Künstlinger, E. Breitmaier, Synthesis 1983 (2), 161-162). Deviating from the known method, the product was isolated as imidazo[1,2-a]pyrimidine hydroperchlorate by adding perchloric acid.

Fp. 195° C.
$^1$H-NMR (500 MHz, CD$_3$CN) [ppm]:
8.99-8.96 (m, 2H); 7.98 (d, 1H); 7.93 (d, 1H); 7.58 (dd, 1H)
MS: m/z=119 [M]$^+$

2. 5,6,7,8-Tetrahydro-imidazo[1,2-a]pyrimidine 4.2 g imidazo[1,2-a]pyrimidine hydroperchlorate were heated for 8 h in an acetic acid solution with palladium on activated charcoal, with H$_2$ fed in. Subsequent filtration, removal of the solvent and addition of diethyl ether yielded the 5,6,7,8-tetrahydro-imidazo[1,2-a]pyrimidine hydroacetate in the form of colorless crystals, which were recrystallized from ethanol.

Yield: 3.21 g
Fp. 65° C.
$^1$H-NMR (500 MHz, DMSO-d$_6$) [ppm]:
6.97 (d, 1H); 6.91 (d, 1H); 3.90 (t, 2H); 3.25 (t, 2H); 1.98 (quint., 2H)

The 5,6,7,8-tetrahydro-imidazo[1,2-a]pyrimidine was released in an alkaline ethanol solution.

Yield: 3.08 g
Fp. 110° C.
$^1$H-NMR (500 MHz, DMSO-d$_6$) [ppm]:
6.51 (d, 1H); 6.36 (d, 1H); 6.09 (s, 1H); 3.80 (t, 2H); 3.16 (t, 2H); 1.90 (quint., 2H)
MS: m/z=123 [M]$^+$

EXAMPLE 2

1. 2-amino-4,6-dimethyl-1,4,5,6-tetrahydropyrimidine 1 g 2-amino-4,6-dimethylpyrimidine was heated for 14 h in a hydrochloric acid environment (2 M HCl) with palladium on activated charcoal as a catalyst, with H$^2$ fed in. Subsequent filtration, removal of the solvent and addition of diethyl ether yielded the 2-amino-4,6-dimethyl-1,4,5,6-tetrahydropyrimidine hydrochloride, which was recrystallized from i-propanol/diethyl ether and dried in a vacuum.

Yield: 1.03 g
Fp. 129° C.
$^1$H-NMR (500 MHz, DMSO-d$_6$) [ppm]:
8.14 (s, 2H); 6.81 (s, 2H); 3.48 (m, 2H); 1.98 (d, 1H); 1.14 (d, 6H); 1.10 (d, 1H)

The 2-amino-4,6-dimethyl-1,4,5,6-tetrahydropyrimidine was released in an alkaline ethanol solution.

$^1$H-NMR (500 MHz, DMSO-d$_6$) [ppm]:
3.46 (m, 2H); 1.98 (m, 1H); 1.13 (d, 6H); 1.10 (d, 1H)

2. 2,4-dimethyl-3,4-dihydro-2H-pyrimido[1,2-a]pyrimidine hydroperchlorate 0.66 g 2-amino-4,6-dimethyl-1,4,5,6-tetrahydropyrimidine was refluxed to boiling point in a methanolic solution with the addition of perchloric acid with an equimolar amount of 1,1,3,3-tetramethoxypropane. Removing the solvent and coating the residue with a layer of diethyl ether yielded the 2,4-dimethyl-3,4-dihydro-2H-pyrimido[1,2-a]pyrimidine hydroperchlorate, which was filtered off and dried in a vacuum.

Yield: 0.46 g
$^1$H-NMR (500 MHz, DMSO-d$_6$) [ppm]:
9.86 (s, 1H); 8.75 (dd, 1H); 8.55 (dd, 1H); 6.99 (dd, 1H); 4.43 (m, 1H); 3.76 (m, 1H); 2.29 (m, 1H); 1.69 (quar, 1H); 1.57 (d, 3H);
1.27 (d, 3H)

3. 2,4-dimethyl-1,3,4,6,7,8-hexahydro-2H-pyrimido[1,2-a]pyrimidine 0.5 g 2,4-dimethyl-3,4-dihydro-2H-pyrimido[1,2-a]pyrimidine hydroperchlorate was heated for 8 h in an acetic acid solution with palladium on activated charcoal, with H$_2$ fed in. Subsequent filtration, removal of the solvent and addition of diethyl ether yielded the 2,4-dimethyl-1,3,4,6,7,8-hexahydro-2H-pyrimido[1,2-a]pyrimidine hydroacetate in the form of colorless crystals, which were recrystallized from ethanol.

Yield: 0.37 g
Fp. 101° C.
$^1$H-NMR (500 MHz, DMSO-d$_6$) [ppm]:
7.47 (s, 1H); 7.09 (s, 1H); 3.50-3.55 (m, 1H); 3.43-3.39 (m, 1H); 3.35-3.21 (m, 3H); 3.05-3.03 (m, 1H); 2.11 (m, 1H); 1.95-1.91 (m, 1H); 1.78-1.71 (m, 1H); 1.37-1.30 (quar, 1H); 1.24 (d, 3H); 1.14 (d, 3H)

The 2,4-dimethyl-1,3,4,6,7,8-hexahydro-2H-pyrimido[1,2-a]pyrimidine was released in an alkaline ethanol solution.

Yield: 0.1 g
Fp. 133° C.
$^1$H-NMR (500 MHz, DMSO-d$_6$) [ppm]:
3.24-3.16 (m, 3H); 3.16-3.14 (m, 1H); 3.09-2.93 (m, 1H); 2.86-2.83 (m, 1H); 1.89-1.85 (m, 1H); 1.77-1.73 (m, 1H); 1.65-1.58 (m, 1H); 1.17-1.10 (m, 4H); 0.97 (d, 3H)
MS: m/z=167 [M]$^+$

EXAMPLE 3

1. Benzimidazo[1,2-a]pyrimidine hydroperchlorate

The production process followed a method described in the literature (M. Künstlinger, E. Breitmaier, Synthesis 1983 (2), 161-162). Deviating from this, the product was isolated as benzimidazo[1,2-a]pyrimidine hydroperchlorate by adding perchloric acid.

Fp. 245° C.
$^1$H-NMR (500 MHz, DMSO-d$_6$) [ppm]:
9.98 (dd, 1H); 9.26 (dd, 1H); 8.60 (d, 1H); 7.95 (d, 1H); 7.86-7.81 (m, 2H);
7.73 (t, 1H)

2. 1,2,3,4-tetrahydro-benzimidazo[1,2-a]pyrimidine 0.602 g benzimidazo[1,2-a]pyrimidine hydroperchlorate was heated for 9 h in a hydrochloric acid solution (2 M HCl) with palladium on activated charcoal, with $H_2$ fed in. Subsequent filtration, removal of the solvent and addition of diethyl ether yielded the 1,2,3,4-tetrahydro-benzimidazo[1,2-a]pyrimidine hydrochloride in the form of colorless crystals, which were recrystallized from ethanol.

Yield: 0.18 g
Fp. 212° C.
$^1$H-NMR (500 MHz, DMSO-$d_6$) [ppm]:
12.62 (s, 1H); 9.18 (s, 1H); 7.47 (m, 1H); 7.38 (m, 1H); 7.27 (m, 1H);
4.08 (t, 2H); 3.48 (m, 2H); 2.14 (quint., 2H)
MS: m/z=174 [M]$^+$ The 1,2,3,4-tetrahydro-benzimidazo[1,2-a]pyrimidine was released in an alkaline ethanol solution.

Fp. 190° C.
$^1$H-NMR (500 MHz, DMSO-$d_6$) [ppm]:
7.13-7.07 (m, 3H); 6.92 (m, 1H); 6.85 (m, 1H); 3.96 (t, 2H); 3.31 (t, 2H);
2.03 (quint., 2H)
MS: m/z=173 [M]$^+$ General Synthesis of the Complexes of the Type $M_2L_4$ $MCl_4$ ($WCl_4$, 1.00 g, 3.07 mmol), at least 2 equivalents of the respective ligands (9.21 mmol) and potassium in excess (approx. 1 g) are refluxed in 50 mL THF. It is then allowed to cool and the mother liquor is filtered off. The filtrate is concentrated until dry and extracted with toluene. The product is precipitated with hexane as a brown solid, isolated by filtration and dried in a high vacuum. Yields around 30%.

EXAMPLE 4

Tetrakis[tetrahydro-imidazo[1,2-a]pyrimidinato]ditungsten-II

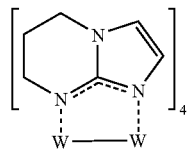

Synthesis as described above with 1.13 g of the ligand 5,6,7,8-tetrahydro-imidazo[1,2-a]pyrimidine.

$^1$H-NMR (500 MHz, $C_6D_6$) [ppm]:
6.7-6.2 (br, 2H); 3.8-3.3 (br, 4H); 1.9-1.3 (br, 2H).

EXAMPLE 5

Tetrakis[dimethyl-1,3,4,6,7,8-hexahydro-2H-pyrimido-1,2-a]pyrimidinato]ditungsten-II

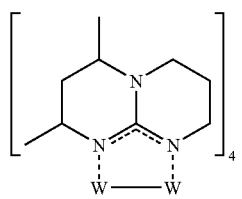

Synthesis as described above with 1.54 g of the ligand 2,4-dimethyl-1,3,4,6,7,8-hexahydro-2H-pyrimido-[1,2-a]pyrimidine.

$^1$H-NMR (500 MHz, $C_6D_6$) [ppm]:
3.5-2.6 (br, 4H); 2.0-1.3 (br, 4H); 1.3-0.9 (br, 6H).
ESI-MS: m/z=184 [M$^+$+30H].

EXAMPLE 6

Tetrakis[tetrahydro-benzo[4,5]imidazo[1,2a]pyrimidinato]ditungsten-II

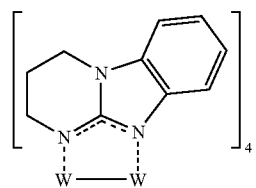

Synthesis as described above with 1.54 g of the ligand 1,2,3,4-tetrahydro-benzimidazo[1,2-a]pyrimidine.

In a modification of the general synthesis formula, this product is precipitated from the mother liquor with hexane. The solid isolated is not soluble in toluene.

$^1$H-NMR (500 MHz, THF-d8) [ppm]:
6.60 (m, br, 1H); 6.55 (m, br, 1H); 6.40 (m, br, 1H); 6.34 (m, br, 1H);
3.72 (br, 2H); 3.42 (br, 2H); 1.77 (br, 2H).

Carbenes

Numerous standard procedures are known in the literature for synthesizing N-heterocyclic carbenes NHC, namely the imidazole process, the thioketone process and the silver oxide process (metal transfer process). On this subject, see: W. A. Herrmann, Angew. Chem., Int. Ed. Engl. 41 (2002) 1290-1309; W. A. Herrmann, C. Kocher, Angew. Chem., Int. Ed. Engl. 36 (1997) 2162-87; A. H. Cowley, J. Organomet. Chem. 617-8 (2001) 105-9; T. Westkamp, V. P. W. Böhm, W. A. Herrmann, J. Organomet. Chem. 600 (2000) 12-22.

The thioketone process is based substantially on the principle which is also used for the silylenes and germylenes. However, instead of the $GeCl_2$ or $SiCl_4$, thiophosgene is used, followed by reduction with potassium, sodium amalgam or $KC_8$ (N. Kuhn, T. Kratz, Synthesis (1993) 561; F. E. Hahn, L. Wittenbecher, R. Boese, D. Bläser, Chem. Eur. J. 5 (1999) 1931-5).

In the imidazole process, the N-substituted imidazole parent substance is isolated first of all. The second nitrogen atom is then usually quaternized with an alkyl halide, and in the final step, the imidazolium salt is reacted to the carbene with a suitable base ($KOBu^t$, $Cs_2CO_3$, BuLi etc) (see, for example: A. J. Arduengo III, R. L. Harlow, M. Kline, J. Am. Chem. Soc. 113 (1991) 361-3; M. R. Grimmet, Adv. Heterocyclic Chemistry 12 (1970) 105 and 134).

The silver oxide process is a variant of the imidazole process. In this case, silver oxide is used as the base. A silver complex of the carbene forms. This can transfer the carbene to another metal (metal transfer) (Q.-X. Liu, F.-B. Xu, Q.-S. Li, X.-S. Zeng, X.-B. Leng, Y. L. Chou, Z.-Z. Zhang, Organometallics 22 (2003) 309-14; T. Ramnial, C. D. Abernethy, M. D. Spicer, I. D. McKenzie, I. D. Gay, J. A. C. Clyburne, Inorg. Chem. 42 (2003) 1391-3).

Silylenes

The synthesis of the N-heterocyclic silylenes is analogous to that of the corresponding germylenes. However, silicon (IV) chloride is used, which means that there must also be a subsequent reduction step (see, for example, M. Denk, R.

Lennon, R. Hayshi, R. West, A. V. Belyakov, H. P. Verne, A. Haaland, M. Wagner, N. Metzler, J. Am. Chem. Soc. 116 (1994) 2691-2; B. Gehrhus, M. F. Lappert, J. Organomet. Chem. 617-8 (2001) 209-23).

Germylenes

The heterocyclic germylenes (N, S) can usually be isolated by metallizing corresponding di-imines, diamines, aminothioles or dithioles and subsequently reacting them with germanium(II) chloride in accordance with known methods (J. Pfeiffer, M. Noltemeyer, A. Meller, Z. Anorg. Allg. Chem. 572 (1989) 145-50; A. Meller, C.-P. Gräbe, Chem. Ber. 118 (1985) 2020-9; J. Pfeiffer, W. Maringgele, M. Noltemeyer, A. Meller, Chem. Ber. 122 (1989) 245-52; O. Kühl, P. Lönnecke, J. Heinicke, Polyhedron 20 (2001) 2215-22).

Synthesizing the metal complexes is described, for example, in: O. Kühl, P. Lönnecke, J. Heinicke, Inorg. Chem. 42 (2003) 2836-8; W. A. Herrmann, M. Denk, J. Behm, W. Scherer, F.-R. Klingan, H. Bock, B. Solouki, M. Wagner, Angew. Chem., Int. Ed. Engl. 31 (1992) 1485.

π Perimeter

In the π perimeter ligands and their metal compounds, there are a large number of compounds and therefore many different methods of synthesizing them. The following are mentioned by way of example:

Cyclopentadienyl: C. Janiak, H. Schumann, Adv. Organomet. Chem. 33 (1991) 331; J. Okuda, Top. Curr. Chem. 160 (1991) 99; N. J. Coville, K. E. du Plooy, W. Pickl, Coord. Chem. Rev. 116 (1992) 1; R. L. Halterman, Chem. Rev. 92 (1992) 965; M. L. Hays, T. P. Hanusa, Adv. Organomet. Chem. 40 (1996) 117; S. Brydges, L. E. Harrington, M. J. McGlinchey, Coord. Chem. Rev. 233-4 (2002) 75; T. Cuenca, P. Royo, Coord. Chem. Rev. 193-5 (1999) 447-98.

Arenes: A. S. Abd-El-Aziz, Coord. Chem. Rev. 233-4 (2002) 177; A. S. Abd-El-Aziz, Coord. Chem. Rev. 203 (2000) 219; R. D. Pike, D. A. Sweigart, Coord. Chem. Rev. 187 (1999) 183.

Cycloheptatrienyl: M. L. H. Green, D. P. K. Ng, Chem. Rev. 95 (1995) 439; M. Tamm, B. Dressel, R. Fröhlich, J. Org. Chem. 65 (2000) 6795; M. Tamm, T. Bannenberg, R. Dressel, R. Fröhlich, D. Kunz, Organometallics 20 (2001) 900; M. Tamm, T. Bannenberg, R. Fröhlich, S. Grimme, M. Gerenkamp, Dalton Trans. (2004) 482-91; M. Tamm, B. Dressel, T. Lügger, R. Fröhlich, S. Grimme, Eur. J. Inorg. Chem. (2003) 1088.

Cyclo-octatetraenediyl: F. T. Edelmann, D. M. M. Freckmann, H. Schumann, Chem. Rev. 102 (2002) 1851; P. W. Roesky, Eur. J. Inorg. Chem. (2001) 1653.

Arene FeCp: these are built up either from the ferrocene by arene substitution and subsequent reduction or by reacting $Cp^RFe(CO)_2Br$ with the arene and subsequent reduction: J.-R. Hamon, D. Astruc, P. Michaud, J. Am. Chem. Soc. 103 (1981) 758-66. Other arene transition-metal-metal Cp complexes can also be isolated accordingly, such as with the metal atoms Mn, Co, Ni, Cu, Zn or even Cr, Mo, W.

Borates

Above all, borates in accordance with the compounds II to 14 and 16 can be produced by means of the following synthesis methods, for example, with other suitable synthesis methods also being possible in each case. It goes without saying that other tripod ligands can optionally also be obtained by means of similar synthesis methods:

Building Up the Pyrazole:
The synthesis is generally effected by reacting a β-diketone with hydrazine: M. B. Smith, J. March, March's Advanced Organic Chemistry, Wiley, New York, 5th edition, 1193

Building Up the Chelate Ligand:
According to a first variant, synthesis can be effected by reacting the pyrazole with $KBH_4$, as is described, for example, by S. Trofimenko, J. Am. Chem. Soc. 89 (1967) 3170

Alternatively, the chelate ligand can be obtained in a multistage synthesis process by reacting boric acid trimethylester and a Grignard compound to isoboronic acid and subsequently reacting it with the pyrazole and pyrazolate: F. R. Bean, J. R. Johnson, J. Am. Chem. Soc. 54 (1932) 4415; E. Khotinsky, M. Melamed, Chem. Ber. 42 (1909) 3090; H. R. Snyder, J. A. Kuck, J. R. Johnson, J. Am. Chem. Soc. 60 (1938) 105; D. L. Reger, M. E. Tarquini, Inorg. Chem. 21 (1982) 840.

The build-up of the metal complex used in accordance with the invention is described, for example, in: S. Trofimenko, J. Am. Chem. Soc. 88 (1966) 1842; C. A. Kilner, E. J. L. McInnes, M. A. Leech, G. S. Beddard, J. A. K. Howard, F. E. Mabbs, D. Collison, A. J. Bridgeman, M. A. Halcrow, Dalton Trans. (2004) 236-43; S. Trofimenko: Scorpionates: The Coordination Chemistry of Polypyrazolylborate Ligands, Imperial College Press, London 1999; S. Trofimenko, Chem. Rev. 93 (1993) 943; S. Trofimenko, Chem. Rev. 72 (1972) 497; S. Trofimenko, J. Am. Chem. Soc. 89 (1967) 3170; S. Trofimenko, J. Am. Chem. Soc. 89 (1967) 6288; A. Paulo, J. D. G. Correia, M. P. C. Campello, I. Santos, Polyhedron 23 (2004) 331-60; S. Trofimenko, Polyhedron 23 (2004) 197-203.

Corresponding ligands with a carbon bridge atom instead of boron are obtainable according to C. Pettinari, A. Cingolani, G. G. Lobbia, F. Marchetti, D. Martini, M. Pellei, R. Pettinari, C. Santini, Polyhedron 23 (2004) 451-69.

Ligands and complexes based on 2-imidazolidine thione can be obtained according to J. K. Voo, C. D. Incarvito, G. P. A. Yap, A. L. Rheingold, C. G. Riordan, Polyhedron 23 (2004) 405-12; H. M. Alvarez, J. M. Tanski, D. Rabinovich, Polyhedron 23 (2004) 395-403; C. A. Dodds, M. Jagoda, J. Reglinski, M. D. Spicer, Polyhedron 23 (2004) 445-50.

Carboranes

Building up the carborane system generally requires special conditions. Some representatives are commercially available.

Corresponding synthesis methods are described, for example, by R. A. Wiersboeck, M. F. Hawthorne, J. Am. Chem. Soc. 86 (1964) 1642-3; J. A. Dupont, M. F. Hawthorne, J. Am. Chem. Soc. 86 (1964) 1643; L. J. Todd, A. R. Burke, A. R. Garber, H. T. Silverstein, B. N. Storhoff, Inorg. Chem. 9 (1970) 2175-9.

The synthesis of the corresponding metal complexes has been described, for example, by J. Bould, John D. Kennedy, G. Ferguson, F. T. Deeney, G. M. O'Riordan, T. R. Spalding, Dalton Trans. (2003) 4557-64.

Triazacycloalkanes

The substituents at the nitrogen atom can be isolated by alkylation or arylation from the trisammonium bromide of the parent substance. They are subsequently reacted with metal precursors. See, for example: R. Zhou, C. Wang, Y. Hu, T. C. Flood, Organometallics 16 (1997) 434; L. Wang, C. Wang, R. Bau, T. C. Flood, Organometallics 15 (1996) 491; L. Wang. J. R. Sowa Jr., C. Wang, R. S. Lu, P. G. Gasman, T. C. Flood, Organometallics 15 (1996) 4240; S. M. Yang, M. C. W. Chan, K. K. Cheung, C. M. Che, S. M. Peng, Organometallics 16 (1997) 2819; S. M. Yang, W. C. Cheng, S. M. Peng, K. K. Cheung, C. M. Che, Dalton Trans (1995) 2955; A. L. Gott, P. C. McGowan, T. J. Podesta, C. W. Tate, Inorg. Chim. Acta 357 (2004) 689-98.

Tripod Ligands

The tripod ligand class of compounds is also characterized by its wide variety. Some synthesis methods regarding compounds to be used in accordance with the invention have been described by:

Carbene-based ligands, in particular with a carbene donor atom: H. Nakai, Y. Tang, P. Gantzel, K. Meyer, Chem. Comm. (2003) 24-5; X. Hu, I. Castro-Rodriguez, K. Meyer, J. Am. Chem. Soc. 125 (2003) 12237-45; U. Kernbach, M. Ramm, P. Luger, W. P. Fehlhammer, Angew. Chem., Int. Ed. Engl. 35 (1996) 310-2;

Nitrogen-based ligands, in particular with an N donor atom: T. Rüther, N. Braussaud, K. J. Cavell, Organometallics 20 (2001) 1247-50; L. Peters, N. Burzlaff, Polyhedron 23 (2004) 245-51; V. V. Karambelkar, R. C. diTargiani, C. D. Incarvito, L. N. Zakharov, A. L. Rheingold, C. L. Stem, D. P. Goldberg, Polyhedron 23 (2004) 471-80; D. L. Reger, J. R. Gardiner, M. D. Smith, Polyhedron 23 (2004) 291-9; M. Scarpellini, J. C. Toledo Jr., A. Neves, J. Ellena, E. E. Castellano, D. W. Franco, Inorg. Chim. Acta 357 (2004) 707-15;

Phosphorus-based ligands, in particular with a P donor atom: H. A. Mayer, W. C. Kaska, Chem. Rev. 94 (1994) 1239; B. C. Janssen, A. Asam, G. Huttner, V. Sernau, L. Zsolnai, Chem. Ber. 127 (1994) 501; H. Heidel, J. Scherer, A. Asam, G. Huttner, O. Walter, L. Zsolnai, Chem. Ber. 128 (1995) 293; S. Beyreuther, J. Hunger, G. Huttner, S. Mann, L. Zsolnai, Chem. Ber. 129 (1996) 745; J. C. Thomas, J. C. Peters, Polyhedron 23 (2004) 489-97.

Sulphur-based ligands, in particular with an S donor atom: H. M. Alvarez, J. M. Tanski, D. Rabinovich, Polyhedron 23 (2004) 395-403.

The preparation of metallotriphos ligands that can be used in accordance with the invention has been described by: O. Kühl, S. Blaurock, J. Sieler E. Hey-Hawkins, *Polyhedron* 20 (2001) 2171-7; G. S. Ferguson, P. T. Wolczanski, L. Parkanyi, M. C. Zonneville, Organometallics 7 (1988) 1967; S. M. Baxter, G. S. Ferguson, P. T. Wolczanski, J. Am. Chem. Soc. 110 (1988) 4231.

Fullerenes

In general, it is possible to proceed in a similar way to the cyclopentadienyl ligands, though without wishing to be restricted to that. For this purpose, the metallated species can be reacted with a metal precursor. See, for example: L. A. Rivera-Rivera, G. Crespo-Roman, D. Acevedo-Acevedo, Y. Ocasio Delgado, J. E. Cortes-Figueroa, Inorg. Chim. Acta 357 (2004) 881-7.

Pincer Ligands

Regarding the synthesis of pincer ligands that can be used in metal complexes of the invention, see, for example: A. M. Magill, D. S. McGuinness, K. J. Cavell, G. J. P. Britovsek, V. C. Gibson, A. J. P. White, D. J. Williams, A. H. White, B. W. Skelton, J. Organomet. Chem. 617-8 (2001) 546-60.

Carbene-based pincer ligands: The ligand system can be synthesized by high-temperature synthesis from 2,6-dibromopyridine and N-substituted imidazole: R. S. Simons, P. Custer, C. A. Tessier, W. J. Youngs, Organometallics 22 (2003) 1979-82; J. A. Loch, M. Albrecht, E. Peris, J. Mata, J. W. Faller, R. H. Crabtree, Organometallics 21 (2002) 700; M. Poyatos, J. A. Mata, E. Falomir, R. H. Crabtree, E. Peris, Organometallics 22 (2003) 1110-4; A. A. D. Tulloch, A. A. Danopoulos, S. Winston, S. Kleinhenz, G. Eastham, Dalton Trans (2000) 4499; A. A. Danopoulos, A. A. D. Tulloch, S. Winston, G. Eastham, M. B. Hursthouse, Dalton Trans (2003) 1009-15.

Phosphorus-based pincer ligands, in particular with a P donor atom, can be isolated from an alpha,alpha'-xylene- or lutidine dihalide by salt metathesis with a secondary phosphanide, for example according to W. V. Dahlhoff, S. M. Nelson, J. Chem. Soc (A) (1971) 2184; L. Barloy, S. Y. Ku, J. A. Osborn, A. DeCian, J. Fisher, Polyhedron 16 (1997) 291; B. D. Steffey, A. Miedamer, M. L. Maciejewski-Farmer, P. R. Bernatis, A. M. Herring, V. S. Allured, V. Caperos, D. L. DuBois, Organometallics 13 (1994) 4844; C. Hahn, A. Vitagliano, F. Giordano, R. Taube, Organometallics 17 (1998) 2060; G. Vasapollo, C. F; Nobile, A. Sacco, J. Organomet. Chem. 296 (1985) 435-41; G. Jin, H. M. Lee, I. D. William, J. Organomet. Chem. 534 (1997) 173; G. Jin, H. M. Lee, H. P. Xin, I. D. William, Organometallics 15 (1996) 5453; T. Karlen, P. Dani, D. M. Grove, P. Steenwinkel, G. Van Koten, Organometallics 15 (1996) 5687;

Bidentate Ligands

Biscarbenes with carbene donor atoms which can be used in accordance with the invention can be prepared according to M. Poyatos, M. Sanau, E. Peris, Inorg. Chem. 42 (2003) 2572-6. The synthesis follows the literature citations already described above.

Monodentate Ligands

The synthesis can follow the literature citations already described above. Ligands of this kind are in some cases also available commercially.

Matrix Materials

In the present invention, suitable n-dopants for organic semiconducting materials such as electron transport materials are described, e.g. those generally used in electronic devices, including optoelectronic devices, such as OLEDs, field effect transistors or organic solar cells. The semiconducting materials are preferably intrinsically electron-conductive.

The matrix material may consist partially (>10 or >25% by weight) or substantially (>50% by weight or >75% by weight) or completely of a metal phthalocyanine complex, a Buckminster fullerene, optionally also a porphyrin complex, especially a metal porphyrin complex, an oligothiophene, oligophenyl, oligophenylene vinylene or oligofluorene compound, the oligomers preferably comprising 2-500 or more, preferably 2-100 or 2-50 or 2-10 monomeric units. The oligomer may also comprise >4, >6 or >10 or more monomeric units, especially also for the ranges specified above, i.e., for example, 4 or 6-10 monomeric units, 6 or 10-100 monomeric units or 10-500 monomeric units. The monomers or oligomers can be substituted or unsubstituted, and block or mixed polymers from the oligomers mentioned may also be present. The matrix can also be a mixture of oligomers with various chain lengths, as is the case for standard polymer layers.

The matrix material may also be a compound with a triarylamine unit or spiro-bifluorene compound. The matrix materials mentioned may also be present in combination with one another, optionally also in combination with other matrix materials. The matrix materials may possess electron-pushing substituents such as alkyl or alkoxy residues which have reduced ionization energy or which reduce the ionization energy of the matrix material.

The metal phthalocyanine complexes or porphyrin complexes used as the matrix material may have a metal atom from the main group or the B group. The metal atom Me may in each case be 4, 5 or 6-fold coordinated, such as in the form of oxo (Me=O), dioxo (O=Me=O), imine, di-imine, hydroxo, dihydroxo, amino or diamino complexes, though without being restricted to those. The phthalocyanine complex or porphyrin complex may in each case be partially hydrogenated, though the mesomeric ring system is preferably not disturbed in the process. As the central atom, the phthalocyanine complexes may, for example, contain magnesium, zinc, iron, nickel, cobalt, magnesium, copper or vanadium oxide (=VO). The same or other metal atoms, or oxo-metal atoms may be present in the case of porphyrin complexes.

The following may also be used as n-dopable matrix materials: quinolinato complexes, such as those of aluminium or other metals from the main group, it also being possible for the quinolinato ligand to be substituted. In particular, the matrix material may be tris(8-hydroxy-quinolinato)-aluminium. Other aluminium complexes with O and/or N donor atoms can optionally also be used.

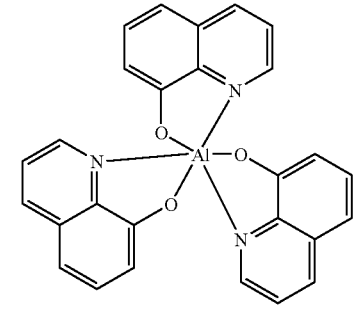

tris (8-hdroxy-quinolinato)-aluminium

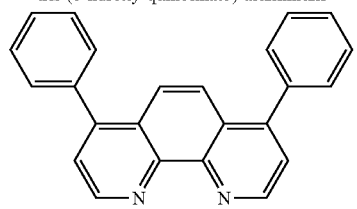

BPhen = bathophenanthroline
(4,7-Diphenyl-1,10-phenanthroline)
C24H16N2

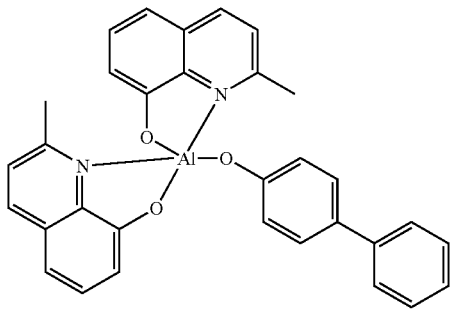

Bis-(2-methyl-8-quinolinolato)-4-(phenyl-phenolato)-aluminium-(III)

The quinolinato complexes may, for example, contain one, two or three quinolinato ligands, the other ligands preferably complexing to the central atom with O and/or N-donor atoms, such as the above Al complex, for example.

Phenanthrolines, which may be substituted or unsubstituted, can also be used as matrix materials, in particular aryl-substituted, such as phenyl or naphthyl-substituted. In particular, Bphen can be used as the matrix material.

Heteroaromatic compounds can also be used as matrix materials, such as in particular triazoles, optionally also pyrroles, imidazoles, triazoles, pyridines, pyrimidines, pyridazines and the like. The heteroaromatic compounds are preferably substituted, in particular aryl-substituted, such as phenyl or naphthyl-substituted. In particular, the triazole shown below can be used as the matrix material.

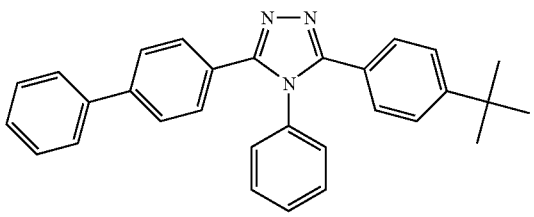

3-(4-Biphenylyl)-4-phenyl-5-tert-butylphenyl-1,2,4-triazole
C30H27N3

The matrix material used preferably consists completely of a metal phthalocyanine complex, in particular ZnPc, a porphyrin complex, or a Buckminster fullerene, in particular fullerene C60.

It goes without saying that the matrix materials mentioned can also be used mixed with each other or with other materials in the context of the invention. It goes without saying that other suitable organic matrix materials can also be used if they possess semiconducting properties.

Doping Concentration

The invention further relates to an organic semiconducting material containing a metal complex of the invention as an n-dopant. The dopant is preferably present in a doping concentration of $\leq 1:1$ relative to the matrix molecule, or the monomeric unit of a polymeric matrix molecule, preferably in a doping concentration of 1:2 or less, particularly preferably 1:5 or less or 1:10 or less. The doping concentration may lie in the region of 1:1 to 1:100,000 or less, especially in the region of 1:5 to 10,000 or 1:10 to 1,000, such as in the region of 1:10 to 1:100 or 1:25 to 1:50, though without being restricted to that.

Performing the Doping

The doping of the respective matrix material with the n-dopant to be used in accordance with the invention can be achieved by means of one or a combination of the following processes:
  (a) Mixed vaporization in a vacuum with one source for the matrix material and one for the dopant.
  (b) Sequential deposition of the matrix material and the n-dopant on a substrate, subsequently diffusing the dopant in, in particular by means of thermal treatment
  (c) Doping a matrix layer using a solution of n-dopant, followed by evaporating the solvent, in particular by means of thermal treatment
  (d) Surface-doping a layer of matrix material by means of a layer of dopant applied to the surface
  (e) Preparing a solution of matrix molecules and dopant and then preparing a layer of this solution by conventional methods, such as evaporating the solvent or hydroextracting The doping may optionally also take the form of evaporating the dopant out of a precursor compound, which is released when the dopant is heated and/or irradiated. As the precursor compound, it is possible in each case to use a carbonyl compound, dinitrogen compound or the like, which cleave off CO, nitrogen or the like when the dopant is released, though other suitable precursors can also be used, such as salts, e.g. halides or the like. Irradiation can be performed by means of electromagnetic radiation, especially visible light, UV light or IR light, such as laser light in each case, or also by other types of radiation. The irradiation is able to provide substantially all the heat needed for vaporization; it is also possible to irradiate in a targeted manner into specific bands of the compounds, precursors or compound complexes, such as charge-transfer complexes, in order, for example, by transferring them into excited states, to facilitate the vaporization of the compounds by dissociation of the complexes. The complex may, however, in particular also be sufficiently stable, to evaporate under the given conditions without dissociation or to be applied to the substrate. It goes without saying that other suitable processes for carrying out the doping can also be used.

n-doped layers of organic semiconductors in accordance with the invention, which are suitable for a wide variety of uses, can thus be prepared in this way.

Semiconducting Layer

With the metal complexes used in accordance with the invention, semiconducting layers can be produced which may optionally also be linear in shape, such as conductivity paths, contacts or the like. The metal complexes may in this case be used as n-dopants together with another compound, which can act as the matrix material, with the doping ratio being 1:1 or less. The metal complex used in accordance with the invention may be present to the other compound or component in each case, but also in higher proportions, so that the ratio of metal complex: compound may be in a ratio of >1:1, such as in a ratio of $\geq 2:1$, $\geq 5:1$, $\geq 10:1$ or $\geq 20:1$ or higher. The other component in each case may be one of the kind that can be used as the matrix material in the case of preparing doped layers, though without being restricted to this. The metal complex used in accordance with the invention may optionally also be present in substantially pure form, such as in the form of a pure layer.

The region containing a metal complex of the invention or consisting substantially or completely of said metal complex may in particular be contacted in an electrically conductive manner with an organic semiconducting material and/or an inorganic semiconducting material; it may, for example, be arranged on a substrate of this kind.

In accordance with the invention, the metal complexes mentioned are preferably used as n-dopants, e.g. in a ratio of $\leq 1:1$ or $\leq 1:2$, or as explained earlier on. With the metal complexes used as n-dopants in accordance with the invention, it is possible, for example, when fullerene $C_{60}$ is used as the matrix, to obtain semiconducting layers with conductivities at room temperature in the region of $10^{-5}$ S/cm or higher, for example $10^{-3}$ S/cm or higher, e.g. $10^{-1}$ S/cm. When phthalocyanine zinc was used as the matrix, a conductivity of higher than $10^{-8}$ S/cm was obtained, for example $10^{-6}$ S/cm. So far, it has not been possible to dope this matrix with organic donors, because the reduction potential of the matrix is too low. The conductivity of undoped phthalocyanine zinc, on the other hand, is a maximum of $10^{-10}$ S/cm.

It goes without saying that the layer or the structure with a metal complex in accordance with the invention may in each case contain one or more different complexes of this kind.

Electronic Device

Using the organic compounds of the invention to prepare n-doped organic semiconducting materials, which can be arranged in particular in the form of layers or electrical line paths, a wide variety of electronic devices or devices containing them can be produced with an n-doped organic semiconductor layer, which are thus also encompassed by the invention. For the purposes of the invention, the term "electronic devices" also comprises opto-electronic devices. With the compounds of the invention, the electronic characteristics of an electronically functionally effective aspect of the device, such as its electrical conductivity, light-emitting characteristics or the like, can be changed advantageously. Using the metal complexes of the invention as n-dopants, for example, it is possible to improve the conductivity of the doped layers and/or the injection of the charge carriers of contacts into the doped layer.

The invention encompasses in particular organic light-emitting diodes (OLED), organic solar cells, organic diodes, especially those with a high rectification ratio, such as $10^3$-$10^7$, preferably $10^4$-$10^7$ or $10^5$-$10^7$, and organic field effect transistors which are produced using the neutral metal complexes of the invention.

In the electronic device, an n-doped layer in accordance with the invention, based on an organic matrix material, may be present in the following layer structures, for example, the base materials or matrix materials of the individual layers preferably being organic in each case:

M-i-n: metal-isolator-n-doped semiconductor, where the M layer forms the metal base contact and may, for example, be ITO, Au, Ag, Al etc. The top contact forms an ohmic contact with the n-doped layer and may consist, for example, of Al. The "i" layer stands for an undoped layer.

n-i-M: what has been said regarding the M-i-n structure applies; the difference with regard to the latter, however, is that the ohmic contact is provided on the substrate.

p-i-n: p-doped semiconductor-isolator-n-doped semiconductor, n-i-p: n-doped semiconductor-isolator-p-doped semiconductor, "i" is once again an undoped layer, "p" is a p-doped layer. The contact materials here are hole-injecting—in this case, a layer or contact of ITO or Au may be provided on the p-side for example —, or electron-injecting—in this case, a layer or contact of ITO, Al or Ag may be provided on the n-side.

In the above structures, the i-layer may also be omitted if need be, as a result of which sequences of layers with p-n or n-p transitions can be obtained.

The use of the dopant of the invention is not, however, limited to the above-mentioned embodiments; in particular, the layer structures can be supplemented or modified by introducing additional appropriate layers. In particular, OLEDs with sequences of layers of this kind can be built up in each case, in particular with a p-i-n structure or one inverse thereto, with n-dopants of the invention.

With the help of the n-dopants of the invention, organic diodes of the metal-isolator-n-doped semiconductor type (m-i-n) in particular—or also optionally of the p-i-n type— can be produced, for example on the basis of phthalocyanine zinc. These diodes exhibit a rectification ratio of 105 and higher. In addition, using the dopants of the invention, electronic devices with p-n transitions can be produced, in which the same semiconducting material is used for the p as for the n-doped side in each case (homo-p-n transition) and in which a metal complex in accordance with the invention is used for the n-doped semiconducting material. Components of this kind are thus also encompassed by the invention.

The metal complexes may be used in accordance with the invention in the electronic devices, but also in layers, conductivity paths, point contacts or the like if the latter predominate over other components, for example as an injection layer in a pure or substantially pure form.

Practical Embodiments

An electron-rich neutral metal complex in accordance with the invention is provided, wherein the metal complex may in each case be, for example:

M-to-(terpyridine) with M equals Cr, Mn, Fe, Co, Ni, Cu, Zn, Mo, or W; $M_2hpp_4$ with M equals Cr, Mn, Fe, Co, Ni, Cu, Zn, Mo, or W; $M_2(AlkylCOO)_4$ F with M equals Cr, Mn, Fe, Co, Ni, Cu, Zn, Mo, or W and with alkyl in each case, the same as each other or different from one another, with C1 to C10; $M_2(guanidinate)_4$ with M equals Cr, Mn, Fe, Co, Ni, Cu, Zn, Mo, or W; M$_2$(formamidinate)$_4$ with M equals Cr, Mn, Fe, Co, Ni, Cu, Zn, Mo, or W; M$_2$(carboxylate)$_4$ with M equals Cr, Mn, Fe, Co, Ni, Cu, Zn, Mo, or W; M$_2$(halide)$_4$ with M equals Cr, Mn, Fe, Co, Ni, Cu, Zn, Mo, or W; bis($\eta^5$-cyclopentadienyl)-M with M equals Cr, Mn, Fe, CO, Ni, Cu, Zn, Mo, or W; benzene-M-($\eta^5$-cyclopentadienyl) with M equals Cr, Mn, Fe, Co, Ni, Cu, Zn, Mo, or W; Fe(ligand)$_2$, wherein the ligand may be one of the compounds 20 to 37 with E=—C— or —Ge— or —Si—, at least one R, more than one or all R preferably being hydrogen or methyl or ethyl in each case. Instead of Fe, the central atom can also in particular be Cr, Mn, Co, Ni, Cu or Zn or Mo or W in each case. In addition, the compounds 21, 22, 23, 24 in particular can be used, where R is hydrogen or methyl. E can in this case be —C— or —Ge— in particular, as a result of which the corresponding biscarbene ligands or bisgermylene ligands are present. It goes without saying that optionally one or more of the hydrogen atoms of the ligands may be replaced by other residues, including alkyl residues.

It is also possible, for example, for a metal complex according to one of the compounds II to 14, 16 to be prepared, where R and R'' are methyl in each case and E is S in each case. The central atom is Fe. Alternatively, the central atom in each case is Cr, Mn, Co, Ni, Cu, Zn or Mo or W.

Once prepared, the metal complex is vaporized simultaneously with the matrix material. According to the embodiment, the matrix material in each case is phthalocyanine zinc or fullerene C$_{60}$. The N-dopant and matrix material can be vaporized in such a way that the layer deposited on a substrate in a vacuum evaporation unit has a doping ratio of n-dopant to matrix material of 1:10.

The layer of the organic semiconducting material doped in each case with the n-dopants of the invention is applied to an ITO layer (indium tin oxide), which is arranged on a glass substrate. After the n-doped organic semiconductor layer of the invention has been applied, a metal cathode is applied, for example by vapor-deposition of a suitable metal, in order to produce an organic light-emitting diode. It goes without saying that the organic light-emitting diode can also have a so-called inverted layer structure, the sequence of layers being: glass substrate—metal cathode-n-doped organic layer—transparent conductive top layer (for example ITO). It goes without saying that, depending on the particular application, further layers may be provided between the individual layers mentioned.

EXAMPLE 1

The neutral cobalt complex cobalt-bis(phenylene-1-yl-2,6 dipyridyl) (ligand: compound 29) was prepared using a conventional process.

The neutral complex was sealed in ampoules under a protective gas. With oxygen excluded, a vaporizer source was then filled with this material. Doped layers with a dopant: matrix material doping ratio of 1:10 were prepared by the mixed evaporation of the matrix and dopant with ZnPc as the matrix material. In thin-film field effect transistors with a ZnPc layer doped in this way, an increase in the source-drain current for a positive gate voltage was found. This proves the presence of electrons as the majority charge carriers in the ZnPc layer. In this way, it was shown that it is indeed an n-doped semiconducting material.

The same may also apply, mutatis mutandis, to the Ruthenium complex RU-bis-(pyridine-2,6-di-(1H2H-N-imidazolyl-)) (ligand: compound 23 with E=—C—).

EXAMPLE 2

A layer of zinc phthalocyanine (ZnPc) was doped with the metal complex [CR2(hpp)$_4$]. The doped layer was produced by mixed evaporation of the ZnPc matrix and the dopant CR2(hpp)$_4$ in a high vacuum. The concentration of the dopant in the matrix was 1.9 mol %. The sublimation temperature of the dopant was 160° C. The doped layer exhibited a high conductivity of 4×10$^{-6}$ S/cm. By curing the layer at 70° C., it was possible to increase the conductivity to 6×10$^{-5}$ S/cm. The activation energy of the conductivity was 0.27 eV.

EXAMPLE 3

A layer of fullerene C60 was doped with the metal complex cobaltocene. First of all, a pure layer of the fullerene was produced by sublimation in a high vacuum. That layer had a low conductivity of 1×10$^{-7}$ S/cm. The doped layer was then placed in a container in which there was a vaporizer filled with cobaltocene. The container was filled with nitrogen. The cobaltocene was sublimed thermally in that container. The cobaltocene deposited on the surface of the fullerene layer led to the formation there of a thin highly doped layer. The cross-current measured in the layer increased by 3 orders of magnitude in the process. The conductivity of the highly doped layer was therefore at least 1×10$^{-4}$ S/cm. The fullerene layer doped in this way was then transferred back to the vacuum chamber. There, high conductivities of at least 2×10$^{-5}$ S/cm continued to be measured. In this way, it was proven that the increase in conductivity observed was indeed due to the doping of the fullerene, since any layers of pure, neutral cobaltocene that might be formed are not stable, because of their vapor pressure in the high vacuum.

What is claimed is:

1. A metal complex for doping an organic semiconducting matrix material having a structure selected from:

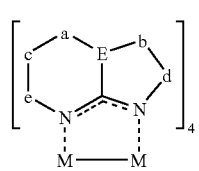

Type 65a wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —NR—, and e is —CR$_9$R$_{10}$— or —NR—, wherein R$_1$, R$_2$, R$_3$, R$_4$, R$_5$, R$_6$, R$_7$, R$_8$, R$_9$, and R$_{10}$ are selected independently from H, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR, wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl;

wherein the bonds b-d and c-e or b-d and a-c may, at the same time or independently of one another, be unsaturated, wherein the bonds b-d, a-c, and c-e may, at the same time or independently of one another, comprise part of a saturated or unsaturated ring system which may also comprise at least one heteroelement selected from the group consisting of: O, S, Se, N, P, Si, Ge, and Sn, wherein the bonds b-d, a-c, and c-e may, at the same time or independently of one another comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, or the structural element a-E-b may comprise a component of an aromatic ring system which may also comprise at least one heteroelement selected from the group consisting of: O, S, Se, and N, wherein the metal M is a transition metal;

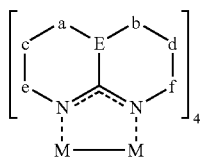

Type 65b wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —SiR$_7$R$_8$—, e is —CR$_9$R$_{10}$— or —NR—, and f is —CR$_{11}$R$_{12}$— or —NR—, wherein R$_1$, R$_2$, R$_3$, R$_4$, R$_5$, R$_6$, R$_7$, R$_8$, R$_9$, R$_{10}$, R$_{11}$, and R$_{12}$ are selected independently from hydrogen, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl,—NR$_2$, or —OR, wherein the structure 65b wherein R$_1$, R$_2$, R$_3$, R$_4$, R$_5$, R$_6$, R$_7$, R$_8$, R$_9$, R$_{10}$, R$_{11}$, and R$_{12}$ are H is excluded wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl, wherein the bonds a-c, b-d, c-e, and d-f, but not simultaneously a-c and c-e and not simultaneously b-d and d-f, may be unsaturated, wherein the bonds a-c, b-d, c-e, and d-f may comprise part of a saturated or unsaturated ring system which may also comprise at least one heteroelement selected from the group consisting of: O, S, Se, N, P, Si, Ge, and Sn, wherein the bonds a-c, b-d, c-e, and d-f may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, wherein the structural element a-E-b canmay comprise a component of an aromatic ring system which may also comprise at least one heteroclement selected from the group consisting of: O, S, Se, and N, wherein the metal M is a transition metal;

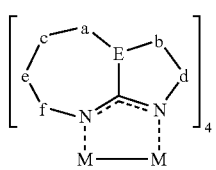

Type 65c wherein a is —CR$_1$R$_2$— or —NR—, b is —CR$_3$R$_4$— or —NR—, c is —CR$_5$R$_6$— or SiR$_5$R$_6$—, d is —CR$_7$R$_8$— or —NR—, e is —CR$_9$R$_{10}$— or —SiR$_9$R$_{10}$—, and f is —CR$_{11}$R$_{12}$—or —NR—, wherein R$_1$, R$_2$, R$_3$, R$_4$, R$_5$, R$_6$, R$_7$, R$_8$, R$_9$, R$_{10}$, R$_{11}$, and R$_{12}$ are selected independently from hydrogen, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR, wherein R is selected independently from C$_1$-C$_{20}$ alkyl, C$_1$-C$_{20}$ cycloalkyl, C$_1$-C$_{20}$ alkinyl, aryl, or heteroaryl, wherein the bonds a-c, c-e, e-f, and b-d, but not simultaneously a-c, c-e, and e-f, and not simultaneously a-c and c-e, and not simultaneously c-e and e f, may be unsaturated, wherein the bonds a-c, c-e, e-f, and b-d may comprise part of a saturated or unsaturated ring system which may also comprise at least one heteroelement selected from the group consisting of: O, S, Se, N, P, Si, Ge, and Sn, wherein the bonds a-c, c-e, e-f, and b-d may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, wherein the structural element a-E-b may comprise a component of an aromatic ring system which may also comprise at least one heteroelement selected from the group consisting of: O, S, Se, and N, wherein the metal M is a transition metal; or

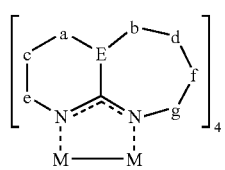

Type 65d wherein a is —CR$_1$R$_2$— or —NR—, b is —CR$_3$R$_4$— or —NR—, C is —CR$_5$R$_6$— or —SiR$_5$R$_6$—, d is —CR$_7$R$_8$— or —SiR$_7$R$_8$—, e is —CR$_9$R$_{10}$— or —NR—, f is —CR$_{11}$R$_{12}$— or —SiR$_{11}$,R$_{12}$—, and g is —CR$_{13}$R$_{14}$— or —NR—, wherein R$_1$, R$_2$, R$_3$, R$_4$, R$_5$, R$_6$, R$_7$, R$_8$, R$_9$, R$_{10}$, R$_{11}$, R$_{12}$, R$_{13}$, and R$_{14}$ are independently selected from H, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR, wherein d and f cannot be simultaneously —SiR$_7$R$_8$— and —SiR$_{11}$R$_{12}$—, respectively, wherein R is selected independently from C$_1$-C$_{20}$ alkyl, C$_1$-C$_{20}$ cycloalkyl. C$_1$-C$_{20}$ alkenyl, C$_1$-C$_{20}$ alkinyl, aryl, or heteroaryl, wherein the bonds a-c, c-e, b-d, d-f, and f-g, but not simultaneously a-c and c-e, and not simultaneously b-d, d-f, and f-g, and not simultaneously b-d and d-f, and not simultaneously d-f and f-g, may be unsaturated, wherein the bonds a-c, c-e, b-d, d-f, and f-g may comprise part of a saturated or unsaturated ring system, which may comprise at least one heteroelement selected from the group consisting of: O, S, Se, N, P, Si, Ge, and Sn, wherein the bonds a-c, c-e, b-d, and f-g may comprise part of an aromatic or condensed aromatic ring system which may comprise at least one heteroelement selected from the group consisting of: O, S, Se, and N, wherein the atom E is an element from the main group, wherein the structural element a-E-b may comprise a component of a saturated or unsaturated ring system which may comprise at least one heteroelement selected from the group consisting of: O, S, Se, N, P, Si, Ge, and Sn, wherein the structural element a-E-b may comprise a component of an aromatic ring system which may comprise at least one heteroelement selected from the group consisting of: O, S, Se, and N, wherein the metal M is a transition metal.

2. The dopant of claim 1, wherein the dopant has the structure of Type 65a wherein $R_1$, $R_3$, $R_5$, $R_7$, and $R_9$ are H, and $R_2$, $R_4$, $R_6$, $R_8$, and $R_{10}$, are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

3. The dopant of claim 1, wherein the dopant has the structure of Type 65b wherein $R_1$, $R_3$, $R_5$, $R_7$, $R_9$, and $R_{11}$ are H, and $R_2$, $R_4$, $R_6$, $R_8$, $R_{10}$, and $R_{12}$ are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

4. The dopant of claim 1, wherein the dopant has the structure of Type 65b wherein a and f or b and e are —NR—.

5. The dopant of claim 1, wherein the dopant has the structure of Type 65c wherein $R_1$, $R_3$, $R_5$, $R_7$, $R_9$, and $R_{11}$, are hydrogen, and $R_2$, $R_4$, $R_6$, $R_8$, $R_{10}$, and $R_{12}$ are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

6. The dopant of claim 1, wherein the dopant has the structure of Type 65c wherein a and d or b and f are —NR—.

7. The dopant of claim 1, wherein the dopant has the structure of Type 65d wherein $R_1$, $R_3$, $R_5$, $R_7$, $R_9$, $R_{11}$, and $R_{13}$ are hydrogen, and $R_2$, $R_4$, $R_6$, $R_8$, $R_{10}$, $R_{12}$, and $R_{14}$ are selected indepdently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

8. The dopant of claim 1, wherein the dopant has the structure of Type 65d wherein a and g or b and e are —NR—.

9. The dopant of claim 1, wherein the element from the main group is selected from the group consisting of: N, P, As, and Sb.

10. The dopant of claim 1, wherein M is selected from W or Mo.

11. A semiconductive material comprising a metal complex according to claim 1, wherein the semiconductive material comprising a metal complex is in the form of an electrically contactable layer or of an electrical conduction path arranged on a substrate.

12. A process for preparing a dopant, comprising the steps of:
(a) reacting an inorganic metal salt of the central atom M with a free base of a ligand in an organic solvent in the presence of a reducing agent and heating to reflux,
(b) isolating the dopant product obtained after reacting and drying, the ligand being selected from:

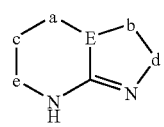

Type 65a' wherein a is —$CR_1R_2$— or —NR—, b is —$CR_3R_4$— or —NR—, c is —$CR_5R_6$— or —$SiR_5R_6$—, d is —$CR_7R_8$— or —NR—, and e is —$CR_9R_{10}$— or —NR—, wherein $R_1$, $R_2$, $R_3$, $R_4$, $R_5$, $R_6$, $R_7$, $R_8$, $R_9$, and $R_{10}$ are selected independently from H, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein the structure 65a' when $R_1$ to $R_{10}$ are H is excluded, wherein the structure 65a' wherein $R_1$ and $R_2$ are aryl is excluded, wherein in the structure 65a' $R_1$ and $R_{10}$ are always H, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl, wherein the bonds b-d and c-e or b-d and a-c may, at the same time or independently of one another, be unsaturated, wherein the bonds b-d, a-c, and c-e may, at the same time or independently of one another, comprise part of a saturated or unsaturated ring system which may also comprise a heteroelement selected from the group consisting of: O, S, Se, N, P, Si, Ge, and Sn, wherein the ligand wherein c-e is selected from cyclohexyl or cyclohexenyl is excluded, or wherein the bonds b-d, a-c and c-e may, at the same time or independently of one another comprise part of an aromatic or condensed aromatic ring system which may also comprise a heteroelement selected from the group consisting of: O, S, Se, and N, wherein the ligand in which b-d, a-c, and c-e are components of benzene is excluded, wherein the atom E is an element from the main group, wherein the structural element a-E-b may comprise a component of a saturated or unsaturated ring system which may also comprise a heteroelement selected from the group consisting of: O, S, Se, N, P, Si, Ge, and Sn, or the structural element a-E-b may comprise a component of an aromatic ring system which may also comprise a heteroelement selected from the group consisting of: O, S, Se, and N, wherein the metal M is a transition metal;

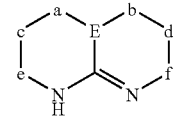

type 65b' wherein a is —$CR_1R_2$— or —NR—, b is —$CR_3R_4$— or —NR—, c is —$CR_5R_6$— or —$SiR_5R_6$—, d is —$CR_7R_8$— or —$CR_7R_8$—, e is —$CR_9R_{10}$— or —NR—, and f is —$CR_{11}R_{12}$— or —NR—, wherein $R_1$, $R_2$, $R_3$, $R_4$, $R_5$, $R_6$, $R_7$, $R_8$, $R_9$, $R_{10}$, $R_{11}$, and $R_{12}$ are selected independently from hydrogen, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein the structure 65b wherein $R_1$, $R_2$, $R_3$, $R_4$, $R_5$, $R_6$, $R_7$, $R_8$, $R_9$, $R_{10}$, $R_{11}$ and $R_{12}$ are H is excluded, wherein the ligand wherein $R_9$, $R_{10}$, $R_{11}$, and $R_{12}$ are selected independently from phenyl, methyl, allyl, $RSCH_2$—, and $ROCH_2$— is excluded, wherein the ligand wherein $R_9$ is phenyl, $R_{10}$ is H, $R_{11}$ is phenyl, and $R_{12}$ is H is excluded, wherein the ligand wherein $R_1$ is phenyl is excluded, wherein the ligand wherein $R_5$, $R_6$, $R_7$, and $R_8$ are phenoxy is excluded, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl, wherein the bonds a-c, b-d, c-e, and d-f, but not simultaneously a-c and c-e and not simultaneously b-d and d-f, may be unsaturated, wherein the bonds a-c, b-d, c-e, and d-f may comprise part of a saturated or unsaturated ring system which may also comprise a heteroelement selected from the group consisting of: O, S, Se, N, P, Si, Ge, and Sn, wherein
the bonds a-c, b-d, c-e, and d-f may comprise part of an aromatic or condensed aromatic ring system which may also comprise a heteroelement selected from the group consisting of: O, S, Se, and N, wherein the ligand in which a-c, b-d, c-e, and d-f are components of benzene is excluded,
wherein the atom E is an element from the main group,
wherein the structural element a-E-b may comprise a component of a saturated or unsaturated ring system which may also comprise a heteroelement selected from the group consisting of: O, S, Se, N, P, Si, Ge, and Sn, excluding the ligand wherein a-E-b comprises a component of a cyclopentyl and pyranyl structure wherein $R_9$, $R_{10}$, $R_{11}$, and $R_{12}$ are alkyl,
wherein the structural element a-E-b may comprise a component of an aromatic ring system which may also comprise a heteroelement selected from the group consisting of: O, S, Se, and N,
wherein the metal M is a transition metal;

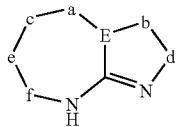

type 65c' wherein a is —$CR_1R_2$— or —NR—, b is —$CR_3R_4$— or —NR—, c is —$CR_5R_6$— or —$SiCR_5R_6$—, d is —$CR_7R_8$— or —NR—, e is —$CR_9R_{10}$— or —$SiCR_9R_{10}$—, and f is —$CR_{11}R_{12}$— or —NR—, wherein $R_1$, $R_2$, $R_3$, $R_4$, $R_5$, $R_6$, $R_7$, $R_8$, $R_9$, $R_{10}$, $R_{11}$, and $R_{12}$ are independently selected from H, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein the ligand wherein $R_1$ to $R_{12}$ are H is excluded, or
wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl,
wherein the bonds a-c, c-e, e-f, and b-d, but not simultaneously a-c, c-e, and e-f, and not simultaneously a-c and c-e, and not simultaneously c-e and e-f, may be unsaturated,
wherein the bonds a-c, c-e, e-f, and b-d may comprise part of a saturated or unsaturated ring system which may also comprise at least one heteroelement selected from the group consisting of: O, S, Se, N, P, Si, Ge, and Sn,
wherein the bonds a-c, c-e, e-f, and b-d may comprise part of an aromatic or condensed aromatic ring system which may also comprise at least one heteroelement selected from the group consisting of: O, S, Se, and N, wherein the ligand wherein the structure is excluded when E is N and simultaneously e-f and/or b-d comprise part of benzene or naphthalene wherein the ligand wherein E is N and simultaneously $R_7$ and $R_8$ are phenyl is excluded, wherein the ligand wherein E is N and $R_3$ is phenyl or benzyl is excluded
wherein the atom E is an element from the main group, wherein the ligand wherein E is N and simultaneously the seven-membered ring comprises more than one unsaturated bond is excluded wherein the structural element a-E-b may comrpise a component of a saturated or unsaturated ring system which may comprise a heteroelement selected from the group consisting of: O, S, Se, N, P, Si, Ge, and Sn,
wherein the structural element a-E-b may comrpise a component of an aromatic ring system which may comprise a heteroelement selected from the group consisting of: O, S, Se, and N,
wherein the metal M is a transition metal; or

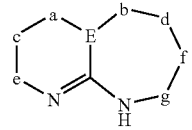

Type 65d' wherein a is —$CR_1R_2$— or —NR—, b is —$CR_3R_4$— or —NR—, c is —$CR_5R_6$— or —$SiR_5R_6$—, d is —$CR_7R_8$— or —$SiR_7R_8$—, e is —$CR_9R_{10}$— or —NR—, f is —$CR_{11}R_{12}$— or —$SiR_{11}R_{12}$—, and g is —$CR_{13}R_{14}$— or —NR—, wherein $R_1$, $R_2$, $R_3$, $R_4$, $R_5$, $R_6$, $R_7$, $R_8$, $R_9$, $R_{10}$, $R_{11}$, $R_{12}$, $R_{13}$, and $R_{14}$ are selected independently from H, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein d and f may not comprise —$SiR_7R_8$— and —$SiR_{11}R_{12}$— simultaneously, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl,
wherein the bonds a-c, c-e, b-d, d-f, and f-g, but not simultaneously a-c and c-e, and not simultaneously b-d, d-f, and f-g, and not simultaneously b-d and d-f, and not simultaneously d-f and f-g, may he unsaturated, wherein the ligand in which b-d and f-g are simultaneously unsaturated is excluded,
wherein the bonds a-c, c-e, b-d, d-f, and f-g may comprise part of a saturated or unsaturated ring system which may comprise a heteroelement selected from the group consisting of: O, S, Se, N, P, Si, Ge, and Sn,
wherein the bonds a-c, c-e, b-d, and f-g may comprise part of an aromatic or condensed aromatic ring system which may comprise a heteroelement selected from the group consisting of: O, S, Se, and N, wherein the ligand in which c-e and f-g simultaneously comprise part of a benzene ring is excluded,
wherein the atom E is an element from the main group,
wherein the structural element a-E-b may comprise a component of a saturated or unsaturated ring system which may comprise a heteroelement selected from the group consisting of: O, S, Se, N, P, Si, Ge, and Sn, wherein the structural element a-E-b may comprise a component of an aromatic ring system which may comprise a heteroelement selected from the group consisting of: O, S, Se, and N, and
wherein the metal M is a transition metal.

13. The process as recited in claim 12, wherein said solvent is selected from the group consisting of an ether, an aromatic solvent, and a mixture thereof.

14. The process as recited in claim 13, wherein said ether is chosen from the group consisting of: dialky ether, cyclic ether, cyclic-, and open-chain polyether.

15. The process as recited in claim 12, wherein said reducing agent is a base metal.

16. The process as recited in claim 15, wherein said base metal is chosen from the group consisting of: sodium, potassium and caesium.

17. The process as recited in claim 12, wherein said isolating step is performed by one of: crystallization, precipitation, or sublimation.

18. The process of claim 12, wherein the ligand has the structure of Type 65a', wherein $R_1$, $R_3$, $R_5$, $R_7$, and $R_9$ are H, and $R_2$, $R_4$, $R_6$, $R_8$, and $R_{10}$ are selected independently from $C_1$-$C_{20}$ alkyl. $C_1$-$C_{20}$ cycloalkyl, $C_1$-$C_{20}$ alkenyl, alkinyl, aryl, heteroaryl, —$NR_2$, or —OR.

19. The process of claim 12, wherein the ligand has the structure of Type 65a', wherein a and d or b and e are —NR—.

20. The process of claim 12, wherein the ligand has the structure of Type 65b', wherein $R_1$, $R_3$, $R_5$, $R_7$, $R_9$, and $R_{11}$ are H, and $R_2$, $R_4$, $R_6$, $R_8$, $R_{10}$, and $R_{12}$ are selected independently from $C_1$-$C_{20}$ alkyl, $C_1$-$C_{20}$ cycloalkyl, alkenyl, $C_1$-$C_{20}$ alkinyl, aryl, heteroaryl, —$NR_2$, or —OR.

21. The process of claim 12, wherein the ligand has the structure of Type 65b', wherein a and f or b and e are —NR—.

22. The process of claim 12, wherein the ligand has the structure of Type 65c', wherein $R_1$, $R_3$, $R_5$, $R_7$, $R_9$, and $R_{11}$ are H, and $R_2$, $R_4$, $R_6$, $R_8$, $R_{10}$, and $R_{12}$ are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

23. The process of claim 12, wherein the ligand has the structure of Type 65c', wherein a and d or b and f are —NR—.

24. The process of claim 12, wherein the ligand has the structure of Type 65d', wherein $R_1$, $R_3$, $R_5$, $R_7$, $R_9$, $R_{11}$, and $R_{13}$ are H, and $R_2$, $R_4$, $R_6$, $R_8$, $R_{10}$, $R_{12}$, and $R_{14}$ are selected independently from $C_1$-$C_{20}$ alkyl, $C_1$-$C_{20}$ cycloalkyl, $C_1$-$C_{20}$ alkenyl, alkinyl, aryl, heteroaryl, —$NR_2$, or —OR.

25. The process of claim 12, wherein the ligand has the structure of Type 65d', wherein a and g or b and e are —NR—.

26. The process of claim 12, wherein E is selected from N, P, As, Sb, B, C, O, Si, S, Se, or Te.

27. The process of claim 12, wherein M is selected from W or Mo.

28. A process for doping an organic semi-conducting matrix material, wherein the matrix material's electrical characteristics are altered, comprising the following steps:
a) combining with an organic semi-conducting matrix material, an effective amount of an n-dopant, wherein the n-dopant is a neutral electron-rich metal complex of formula:

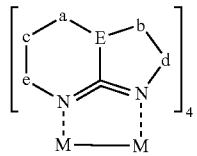

Type 65a wherein a is —$CR_1R_2$— or —NR—, b is —$CR_3R_4$— or —NR—, c is —$CR_5R_6$— or —$SiR_5R_6$—, d is —$CR_7R_8$— or —NR—, and e is —$CR_9R_{10}$— or —NR—, wherein $R_1$, $R_2$, $R_3$, $R_4$, $R_5$, $R_6$, $R_7$, $R_8$, $R_9$, and $R_{10}$ are selected independently from H, $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl, —$NR_2$, or —OR, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl;

wherein the bonds b-d and c-e or b-d and a-c may, at the same time or independently of one another, be unsaturated, wherein the bonds b-d, a-c and c-e may, at the same time or independently of one another, comprise part of a saturated or unsaturated ring system which may also comprise at least one heteroelement selected from the group consisting of: O, S, Se, N, P, Si, Ge, and Sn, wherein the bonds b-d, a-c and c-e may, at the same time or independently of one another comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, or the structural element a-E-b may comprise a component of an aromatic ring system which may also comprise at least one heteroelement selected from the group consisting of: O, S, Se, and N, wherein the metal M is a transition metal;

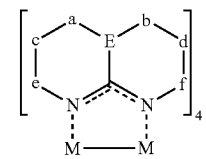

Type 65b wherein a is —$CR_1R_2$— or —NR—, b is —$CR_3R_4$— or —NR—, c is —$CR_5R_6$— or —$SiR_5R_6$—, d is —$CR_7R_8$— or —$SiR_7R_8$—, e is —$CR_9R_{10}$— or —NR—, and f is —$CR_{11}R_{12}$— or —NR—, wherein $R_1$, $R_2$, $R_3$, $R_4$, $R_5$, $R_6$, $R_7$, $R_8$, $R_9$, $R_{10}$, $R_{11}$, and $R_{12}$, are selected independently from hydrogen, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl, wherein wherein the bonds a-c, b-d, c-e, and d-f, but not simultaneously a-c and c-e and not simultaneously b-d and d-f may be unsaturated, wherein the bonds a-c, b-d, c-e, and d-f may comprise part of a saturated or unsaturated ring system which may also comprise at least one heteroelement selected from the group consisting of: O, S, Se, N, P, Si, Ge, and Sn, wherein the bonds a-c, b-d, c-e and d-f may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, wherein the structural element a-E-b may comprise a component of an aromatic ring system which may also comprise at least one heteroelement selected from the group consisting of: O, S, Se, and N, wherein the metal M is;

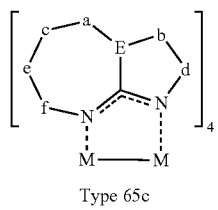

Type 65c wherein a is —$CR_1R_2$— or —NR—, b is —$CR_3R_4$— or —NR—, c is —$CR_5R_6$— or —$SiR_5R_6$—, d is —$CR_7R_8$— or —NR—, e is —$CR_9R_{10}$— or —$SiR_9R_{10}$—, and f is —$CR_{11}R_{12}$— or —NR—, wherein $R_1, R_2, R_3, R_4, R_5, R_6, R_7, R_8, R_9, R_{10}, R_{11}$, and $R_{12}$ are independently selected from hydrogen, $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR, wherein R is selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, or heteroaryl, wherein the bonds a-c, c-e, e-f, and b-d, but not simultaneously a-c, c-e, and e-f, and not simultaneously a-c and c-e, and not simultaneously c-e and e-f, may be unsaturated, wherein the bonds a-c, c-e, e-f, and b-d may comprise part of a saturated or unsaturated ring system which may also comprise at least one heteroelement selected from the group consisting of: O, S, Se, N, P, Si, Ge, and Sn, wherein the bonds a-c, c-e, e-f and b-d may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, wherein the structural element a-E-b may comprise a component of an aromatic ring system which may also comprise at least one heteroelement selected from the group consisting of: O, S, Se, and N, wherein the metal M is a transition metal; or

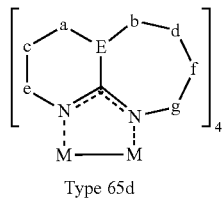

Type 65d wherein a is —$CR_1R_2$— or —NR—, b is —$CR_3R_4$— or —NR—, c is —$CR_5R_6$— or —$SiR_5R_6$—, d is —$CR_7R_8$— or —$SiR_7R_8$—, e is —$CR_9R_{10}$— or —NR—, f is —$CR_{11}R_{12}$— or —$SiR_{11}R_{12}$—, and g is —$CR_{13}R_{14}$— or —NR—, wherein $R_1, R_2, R_3, R_4, R_5, R_6, R_7, R_8, R_9, R_{10}, R_{11}, R_{12}, R_{13}$, and $R_{14}$ are independently selected from H, $C_1$-$C_{20}$ alkyl, $C_1$-$C_{20}$ cycloalky, $C_1$-$C_{20}$ alkenyl, $C_1$-$C_{20}$ alkinyl, aryl, heteroaryl, —$NR_2$, or —OR, wherein d and f cannot be simultaneously —$SiR_7R_8$— and —$SiR_{11}R_{12}$—, respectively, wherein R is selected independently from $C_1$-$C_{20}$ alkyl, $C_1$-$C_{20}$ cycloalkyl, $C_1$-$C_{20}$ alkenyl, alkinyl, aryl, or heteroaryl, wherein the bonds a-c, c-e, b-d, d-f and f-g, but not simultaneously a-c and c-e, and not simultaneously b-d, d-f and f-g, and not simultaneously b-d and d-f, and not simultaneously d-f and f-g, may be unsaturated, wherein the bonds a-c, c-e, b-d, d-f, and f-g may comprise part of a saturated or unsaturated ring system, which may comprise at least one heteroelement selected from the group consisting of: O, S, Se, N, P, Si, Ge, and Sn, wherein the bonds a-c, c-e, b-d and f-g may comprise part of an aromatic or condensed aromatic ring system which may comprise at least one heteroelement selected from the group consisting of: O, S, Se, and N, wherein the atom E is an element from the main group, wherein the structural element a-E-b may comprise a component of a saturated or unsaturated ring system which may comprise at least one heteroelement selected from the group consisting of: O, S, Se, N, P, Si, Ge, and Sn, wherein the structural element a-E-b may comprise a component of an aromatic ring system which may comprise at least one heteroelement selected from the group consisting of: O, S, Se, and N, wherein the metal M is a transition metal.

29. The dopant of claim 28, wherein the dopant has the structure of Type 65a wherein $R_1, R_3, R_5, R_7$, and $R_9$ are H, and $R_2, R_4, R_6, R_8$, and $R_{10}$, are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

30. The dopant of claim 28, wherein the dopant has the structure of Type 65b wherein $R_1, R_3, R_5, R_7, R_9, R_{11}$ are H, and $R_2, R_4, R_6, R_8, R_{10}, R_{12}$ are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

31. The dopant of claim 28, wherein the dopant has the structure of Type 65b wherein a and f or b and e are —NR—.

32. The dopant of claim 28, wherein the dopant has the structure of Type 65c wherein $R_1, R_3, R_5, R_7, R_9, R_{11}$, are hydrogen, and $R_2, R_4, R_6, R_8, R_{10}, R_{12}$ are selected independently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

33. The dopant of claim 28, wherein the dopant has the structure of Type 65c wherein a and d or b and f are —NR—.

34. The dopant of claim 28, wherein the dopant has the structure of Type 65d wherein $R_1, R_3, R_5, R_7, R_9, R_{11}$, and $R_{13}$ are hydrogen, and $R_2, R_4, R_6, R_8, R_{10}, R_{12}$, and $R_{14}$ are selected indepdently from $C_1$-$C_{20}$ alkyl, $C_1$-$C_{20}$ cycloalkyl, $C_1$-$C_{20}$ alkenyl, $C_1$-$C_{20}$ alkinyl, aryl, heteroaryl, —$NR_2$, or —OR.

35. The dopant of claim 28, wherein the dopant has the structure of Type 65d wherein a and g or b and e are —NR—.

36. The dopant of claim 28, wherein the element from the main group is selected from the group consisting of: N, P, As, and Sb.

37. The dopant of claim 28, wherein M is selected from W or Mo.

38. An electronic component comprising an electronically functionally effective region, wherein the electronically effective region comprises one or more neutral metal complexes wherein the metal complex has a structure selected from:

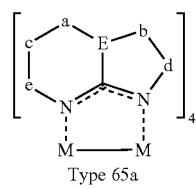

Type 65a wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —NR—, and e is —CR$_9$R$_{10}$— or —NR—, wherein R$_1$, R$_2$, R$_3$, R$_4$, R$_5$, R$_6$, R$_7$, R$_8$, R$_9$, and R$_{10}$ are selected independently from H, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR, wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl;

wherein the bonds b-d and c-e or b-d and a-c may, at the same time or independently of one another, be unsaturated, wherein the bonds b-d, a-c and c-e may, at the same time or independently of one another, comprise part of a saturated or unsaturated ring system which may also comprise at least one heteroelement selected from the group consisting of: O, S, Se, N, P, Si, Ge, and Sn, wherein the bonds b-d, a-c and c-e may, at the same time or independently of one another comprise part of an aromatic or condensed aromatic ring system which may also comprise least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, or the structural element a-E-b may comprise a component of an aromatic ring system which may also comprise at least one heteroelement selected from the group consisting of: O, S, Se, and N, wherein the metal M is a transition metal;

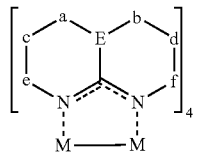

Type 65b wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —SiR$_7$R$_8$—, e is —CR$_9$R$_{10}$— or —NR—, and f is —CR$_{11}$R$_{12}$— or —NR—, wherein R$_1$, R$_2$, R$_3$, R$_4$, R$_5$, R$_6$, R$_7$, R$_8$, R$_9$, R$_{10}$, R$_{11}$, and R$_{12}$ are selected independently from hydrogen, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR, wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl, wherein wherein the bonds a-c, b-d, c-e, and d-f, but not simultaneously a-c and c-e and not simultaneously b-d and d-f may be unsaturated, wherein the bonds a-c, b-d, c-e, and d-f may comprise part of a saturated or unsaturated ring system which may also comprise at least one heteroelement selected from the group consisting of: O, S, Se, N, P, Si, Ge, and Sn, wherein the bonds a-c, b-d, c-e and d-f may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of: O, S, Se, N, P, Si, Ge, and Sn, wherein the structural element a-E-b may comprise a component of an aromatic ring system which may also comprise at least one heteroelement selected from the group consisting of: O, S, Se, and N, wherein the metal M is;

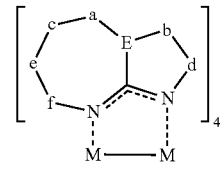

Type 65c wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —NR—, e is —CR$_9$R$_{10}$— or —SiR$_9$R$_{10}$—, and f is —CR$_{11}$R$_{12}$— or —NR—, wherein R$_1$, R$_2$, R$_3$, R$_4$, R$_5$, R$_6$, R$_7$, R$_8$, R$_9$, R$_{10}$, R$_{11}$, and R$_{12}$ are independently selected from hydrogen, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or, —OR, wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl, wherein the bonds a-c, c-e, e-f, and b-d, but not simultaneously a-c, c-e, and e-f, and not simultaneously a-c and c-e, and not simultaneously c-e and e-f, may be unsaturated, wherein the bonds a-c, c-e, e-f, and b-d may comprise part of a saturated or unsaturated ring system which may also comprise at least one heteroelement selected from the group consisting of: O, S, Se, N, P, Si, Ge, and Sn, wherein the bonds a-c, c-e, e-f and b-d may comprise part of an aromatic or condensed aromatic ring system which may also comprise at least one heteroelement selected from the group consisting of: O, S, Se, and N, wherein the atom E is an element from the main group, wherein the structural element a-E-b may comprise a component of a saturated or unsaturated ring system which may also comprise at least one heteroelement selected from the group consisting of O, S, Se, N, P, Si, Ge, and Sn, wherein the structural element a-E-b may comprise a component of an aromatic ring system which may also comprise at least one heteroelement selected from the group consisting of: O, S, Se, and N, wherein the metal M is a transition metal; or

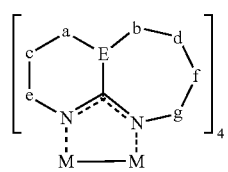

Type 65d wherein a is —CR$_1$R$_2$— or —NR—, b is —CR$_3$R$_4$— or —NR—, c is —CR$_5$R$_6$— or —SiR$_5$R$_6$—, d is —CR$_7$R$_8$— or —SiR$_7$R$_8$—, e is —CR$_9$R$_{10}$— or —NR—, f is —CR$_{11}$R$_{12}$— or —SiR$_{11}$R$_{12}$—, and g is —CR$_{13}$R$_{14}$— or —NR—, wherein R$_1$, R$_2$, R$_3$, R$_4$, R$_5$, R$_6$, R$_7$, R$_8$, R$_9$, R$_{10}$, R$_{11}$, R$_{12}$, R$_{13}$, and R$_{14}$ are independently selected from H, C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$ or —OR, wherein d and f cannot be simultaneously —SiR$_7$R$_8$— and —SiR$_{11}$R$_{12}$—, respectively, wherein R is selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, or heteroaryl, wherein the bonds a-c, c-e, b-d, d-f and f-g, but not simultaneously a-c and c-e, and not simultaneously b-d, d-f and f-g, and not simultaneously b-d and d-f, and not simultaneously d-f and f-g, may be unsaturated, wherein the bonds a-c, c-e, b-d, d-f, and f-g may comprise part of a saturated or unsaturated ring system, which may comprise at least one heteroelement selected from the group consisting of: O, S, Se, N, P, Si, Ge, and Sn, wherein the bonds a-c, c-e, b-d and f-g may comprise part of an aromatic or condensed aromatic ring system which may comprise at least one heteroelement selected from the group consisting of: O, S, Se, and N, wherein the atom E is an element from the main group, wherein the structural element a-E-b may comprise a component of a saturated or unsaturated ring system which may comprise at least one heteroelement selected from the group consisting of: O, S, Se, N, P, Si, Ge, and Sn, wherein the structural element a-E-b may comprise a component of an aromatic ring system which may comprise at least one heteroelement selected from the group consisting of: O, S, Se, and N, wherein the metal M is a transition metal.

39. The dopant of claim 38, wherein the dopant has the structure of Type 65a wherein R$_1$, R$_3$, R$_5$, R$_7$, and R$_9$ are H, and R$_2$, R$_4$, R$_6$, R$_8$, and R$_{10}$, are selected independently C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR.

40. The dopant of claim 38, wherein the dopant has the structure of Type 65b wherein R$_1$, R$_3$, R$_5$, R$_7$, R$_9$, and R$_{11}$ are H, and R$_2$, R$_4$, R$_6$, R$_8$, R$_{10}$, and R$_{12}$ are selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR.

41. The dopant of claim 38, wherein the dopant has the structure of Type 65b wherein a and f or b and e are —NR—.

42. The dopant of claim 38, wherein the dopant has the structure of Type 65c wherein R$_1$, R$_3$, R$_5$, R$_7$, R$_9$, and R$_{11}$, are hydrogen, and R$_2$, R$_4$, R$_6$, R$_8$, R$_{10}$, and R$_{12}$ are selected independently from C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR.

43. The dopant of claim 38, wherein the dopant has the structure of Type 65c wherein a and d or b and f are —NR—.

44. The dopant of claim 38, wherein the dopant has the structure of Type 65d wherein R$_1$, R$_3$, R$_5$, R$_7$, R$_9$, R$_{11}$, and R$_{13}$ are hydrogen, and R$_2$, R$_4$, R$_6$, R$_8$, R$_{10}$, R$_{12}$, and R$_{14}$ are selected indepdently from C$_1$-C$_{20}$ alkyl, C$_1$-C$_{20}$ cycloalkyl, C$_1$-C$_{20}$ alkenyl, C$_1$-C$_{20}$ alkinyl, aryl, heteroaryl, —NR$_2$, or —OR.

45. The dopant of claim 38, wherein the dopant has the structure of Type 65d wherein a and g or b and e are —NR—.

46. The dopant of claim 38, wherein the element from the main group is selected from the group consisting of: N, P, As, and Sb.

47. The dopant of claim 38, wherein M is selected from W or Mo.

48. The electronic component according to claim 38, wherein the electronically effective region comprises an organic semi-conducting matrix material which is n-doped by at least one of the metal complexes.

49. The organic semiconductive material according to claim 48, wherein the molar doping ratio of dopant to matrix molecule or the doping ratio of dopant to monomeric units of a polymeric matrix molecule is between 1:1 and 1:100,000.

50. The electronic component according to claim 48, wherein the electronic component is an organic light-emitting diode, a photovoltaic cell, an organic solar cell, an organic diode, or an organic field-effect transistor, wherein the semi-conducting organic material doped with the at least one or more neutral metal complex is an electronically functionally effective region of the electronic component.

51. The electronic component of claim 38, wherein the metal complex comprises an injection layer in the electronic component.

* * * * *